(12) United States Patent
Tanaka

(10) Patent No.: US 7,772,089 B2
(45) Date of Patent: Aug. 10, 2010

(54) METHOD FOR MANUFACTURING SEMICONDUCTOR DEVICE

(75) Inventor: Koichiro Tanaka, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/369,014

(22) Filed: Feb. 11, 2009

(65) Prior Publication Data

US 2009/0209086 A1  Aug. 20, 2009

(30) Foreign Application Priority Data

Feb. 18, 2008  (JP) .............................. 2008-035851

(51) Int. Cl.
 *H01L 21/30* (2006.01)
 *H01L 21/46* (2006.01)
(52) U.S. Cl. ................ 438/458; 438/459; 257/E21.122
(58) Field of Classification Search ................ 438/458, 438/459; 257/E21.122
 See application file for complete search history.

(56) References Cited

U.S. PATENT DOCUMENTS 6,312,797 B1 * 11/2001 Yokokawa et al. .......... 428/336
6,534,380 B1    3/2003 Yamauchi et al.

FOREIGN PATENT DOCUMENTS

| JP | 11-097379 | 4/1999 |
| JP | 11-145438 | 5/1999 |
| JP | 2001-223175 | 8/2001 |

* cited by examiner

*Primary Examiner*—Matthew Smith
*Assistant Examiner*—John M Parker
(74) *Attorney, Agent, or Firm*—Eric J. Robinson; Robinson Intellectual Property Law Office, P.C.

(57) ABSTRACT

Highly reliable single crystal semiconductor layers and semiconductor devices can be obtained through a fewer manufacturing steps. A method for manufacturing a semiconductor device is proposed. A single crystal semiconductor substrate provided with an insulating film is irradiated with an ion beam to form a damaged region in the single crystal semiconductor substrate; liquid glass is floated over a liquid denser than the liquid glass to shape the liquid glass into a plate; the single crystal semiconductor substrate provided with the damaged region is placed over the plate-like liquid glass so that the insulating film and the liquid glass face each other; the plate-like liquid glass and the single crystal semiconductor substrate are cooled slowly, whereby a glass substrate is obtained from the plate-like liquid glass and concurrently the glass substrate and the single crystal semiconductor substrate are bonded together; and a single crystal semiconductor layer is separated from the single crystal semiconductor substrate along the damaged region.

20 Claims, 14 Drawing Sheets

METHOD FOR MANUFACTURING SEMICONDUCTOR DEVICE

BACKGROUND OF THE INVENTION

1. Field of the Invention

The present invention disclosed in the present specification relates to a method for manufacturing a semiconductor device.

2. Description of the Related Art

In recent years, instead of a bulk silicon wafer, integrated circuits using an SOI (silicon on insulator) substrate have been developed. By utilizing a feature of a thin single crystal silicon layer formed over an insulating layer, a semiconductor layer of a transistor formed in the integrated circuit can be electrically separated from each other completely. Further, since the fully depleted transistors can be formed, a semiconductor integrated circuit with high added value such as high integration, high speed driving, and low power consumption can be realized.

In addition, a method for forming an SOI substrate in which a single crystal silicon layer is bonded to a glass substrate is known (see, for example, Reference 1: Japanese Published Patent Application No. H11-097379). In Reference 1, a separation surface is mechanically polished to remove a defective layer which is formed through hydrogen ion implantation or a step of several to several tens of nanometers on the separation surface.

Further, Reference 2 (Japanese Published Patent Application No. H11-145438) discloses the following: a surface on the SOI layer side of a single crystal silicon wafer to which hydrogen ions are introduced is disposed in close contact with an insulating substrate at room temperature; heat treatment is performed at 100° C. to 300° C. to temporarily bond the single crystal silicon wafer and the insulating substrate together; a single crystal silicon layer is etched; heat treatment at 350° C. to 450° C. is performed on the single crystal silicon wafer and the insulating substrate to finally bond the single crystal silicon wafer and the insulating substrate together; heating at 500° C. or higher is performed to make separation occur with a hydrogen ion implantation layer used as a cleavage plane, so that the single crystal silicon layer is formed as an SOI layer.

On the other hand, as a method for performing heat treatment on a silicon thin film over a substrate, a laser annealing apparatus for processing a laser beam and a microwave by being combined has been known (see, for example, Reference 3: Japanese Published Patent Application No. 2001-223175). Reference 3 discloses a method in which, by irradiating silicon melted by a laser beam with a microwave, cooling time is prolonged more than the case where silicon is melted only by a laser beam to expand silicon crystallization depth.

SUMMARY OF THE INVENTION

An SOI substrate in which a single crystal silicon layer is bonded to a glass substrate needs to be subjected to heat treatment in order to recover its crystallinity. However, in the case of performing heat treatment by laser irradiation, the area irradiated with a one-shot laser beam is small. Thus, it takes long process time to irradiate the whole substrate. It takes longer process time to irradiate a larger substrate.

Furthermore, there is concern that the silicon layer can not be uniformly subjected to heat treatment due to the variation of energy distribution of a laser beam. In such a case, the single crystal silicon layer may have a nonuniform characteristic.

In view of the foregoing problems, it is an object of the present invention disclosed in the present specification to form a single crystal semiconductor layer with few defects and with a uniform characteristic over a glass substrate through a fewer manufacturing steps.

A single crystal semiconductor substrate is placed over molten glass and slow cooling is performed, whereby the single crystal semiconductor substrate and the glass substrate are bonded together concurrently with formation of a glass substrate from the molten glass. Thus, the bonding of the single crystal semiconductor substrate and the glass substrate is strengthened, and accordingly, an SOI substrate is obtained in which formation of a defect such as peeling of a film is hardly caused in a later step.

A single crystal semiconductor layer over a glass substrate is obtained in the following manner: a damaged region (also referred to as an embrittled layer, a fragile layer, or a separation layer) is formed at a desired thickness of a single crystal semiconductor substrate, the single crystal semiconductor substrate and the glass substrate are bonded together, and then, separation is made to occur at the damaged region, whereby a single crystal semiconductor layer is separated from the single crystal semiconductor substrate.

As a method for forming the damaged region, a method in which accelerated ions are introduced into a single crystal semiconductor substrate at a desired depth, a method in which a dense single crystal semiconductor layer is formed over a porous single crystal semiconductor layer, and the like are given.

The present invention disclosed in the present specification relates to a method for manufacturing a semiconductor device including the steps of irradiating with an ion beam a single crystal semiconductor substrate provided with an insulating film to form a damaged region in the single crystal semiconductor substrate, floating liquid glass over a liquid denser than the liquid glass to shape the liquid glass into a plate, disposing the single crystal semiconductor substrate provided with the damaged region over the plate-like liquid glass so that the insulating film and the liquid glass face each other, cooling the plate-like liquid glass and the single crystal semiconductor substrate slowly, whereby a glass substrate is obtained from the plate-like liquid glass and concurrently the glass substrate and the single crystal semiconductor substrate are bonded together, and separating a single crystal semiconductor layer from the single crystal semiconductor substrate along the damaged region.

The present invention disclosed in the present specification relates to a method for manufacturing a semiconductor device including the steps of irradiating with an ion beam a single crystal semiconductor substrate provided with an insulating film to form a damaged region in the single crystal semiconductor substrate, floating liquid glass over a liquid denser than the liquid glass to shape the liquid glass into a plate, disposing the single crystal semiconductor substrate provided with the damaged region over the plate-like liquid glass so that the insulating film and the liquid glass face each other, cooling the plate-like liquid glass and the single crystal semiconductor substrate slowly, whereby a glass substrate is obtained from the plate-like liquid glass and concurrently the glass substrate and the single crystal semiconductor substrate are bonded together, separating a single crystal semiconductor layer from the single crystal semiconductor substrate along the damaged region, and taking a foreign matter between the glass substrate and the single crystal semiconductor layer into the glass substrate.

The present invention disclosed in the present specification relates to a method for manufacturing a semiconductor device including the steps of irradiating with an ion beam a single crystal semiconductor substrate provided with an insulating film to form a damaged region in the single crystal semiconductor substrate, floating liquid glass over a liquid denser than the liquid glass to shape the liquid glass into a plate, disposing over the plate-like liquid glass the single crystal semiconductor substrate provided with the damaged region so that the insulating film and the liquid glass face each other, sticking a substrate support portion onto a side of the single crystal semiconductor substrate which is opposite to a side where the insulating film is formed, cooling the plate-like liquid glass and the single crystal semiconductor substrate slowly, whereby a glass substrate is obtained from the plate-like liquid glass and concurrently the glass substrate and the single crystal semiconductor substrate are bonded together, and separating a single crystal semiconductor layer from the single crystal semiconductor substrate onto the substrate support portion is stuck, along the damaged region.

The single crystal semiconductor substrate is one of a single crystal silicon substrate, a single crystal germanium substrate, a single crystal silicon germanium substrate, a compound semiconductor substrate of gallium arsenide, and a compound semiconductor substrate of indium phosphide.

The insulating film includes one of or two or more of a silicon oxide film, a silicon nitride film, a silicon oxynitride film, a silicon nitride oxide film, a germanium oxide film, a germanium nitride film, a germanium oxynitride film, a germanium nitride oxide film, an aluminum oxide film, a tantalum oxide film, a hafnium oxide film, an aluminum nitride film, an aluminum oxynitride film, and an aluminum nitride oxide film.

The insulating film is an oxide film formed by oxidation of a surface of the single crystal semiconductor substrate in gas including chlorine.

The ion beam is a beam including a hydrogen ion.

The present invention disclosed in the present specification relates to a method for manufacturing a semiconductor device including the steps of forming a porous single crystal semiconductor layer over a single crystal semiconductor substrate, forming a dense single crystal semiconductor layer over the porous single crystal semiconductor layer, floating liquid glass over a liquid denser than the liquid glass to shape the liquid glass into a plate, disposing the single crystal semiconductor substrate provided with the porous single crystal semiconductor layer and the dense single crystal semiconductor layer over the plate-like liquid glass so that the single crystal semiconductor substrate and the liquid glass face each other, cooling the plate-like liquid glass and the single crystal semiconductor substrate slowly, whereby a glass substrate is obtained from the plate-like liquid glass and concurrently the glass substrate and the, single crystal semiconductor substrate are bonded together, and separating the dense single crystal semiconductor layer from the single crystal semiconductor substrate along the porous single crystal semiconductor layer.

The porous single crystal semiconductor layer is formed by anodic oxidation of the single crystal semiconductor substrate.

The present invention disclosed in the present specification relates to a method for manufacturing a semiconductor device including the steps of irradiating with an ion beam a single crystal semiconductor substrate provided with an insulating film to form a damaged region in the single crystal semiconductor substrate, disposing solid glass over a solid of a liquid material denser than liquid glass, disposing over the solid glass the single crystal semiconductor substrate provided with the damaged region so that the insulating film and the solid glass face each other, heating the solid glass and the solid of a liquid material denser than liquid glass, so that the solid glass is turned into the liquid glass and the solid of a liquid material denser than the liquid glass is turned into the liquid material, cooling the liquid glass and the single crystal semiconductor substrate slowly, whereby a glass substrate is obtained from the liquid glass and concurrently the glass substrate and the single crystal semiconductor substrate are bonded together, and separating a single crystal semiconductor layer from the single crystal semiconductor substrate along the damaged region.

The area of a portion of defective bonding between a glass substrate and a single crystal semiconductor substrate can be made extremely small. In addition, since treatment can be performed at high temperature, for example, at a temperature higher than 1000° C., a defect in the single crystal semiconductor substrate which is generated due to the formation of the damaged region in the single crystal semiconductor substrate can be repaired. Thus, a highly reliable single crystal semiconductor layer and a highly reliable semiconductor device can be obtained.

Further, a step of forming the glass substrate and a step of bonding the single crystal semiconductor substrate to the glass substrate can be carried out concurrently; therefore, the present invention is extremely effective for shortening a manufacturing process.

Furthermore, in a semiconductor device manufactured using a single crystal semiconductor layer separated from a single crystal semiconductor substrate, the single crystal semiconductor layer is oriented in the same direction. Accordingly, a highly reliable semiconductor device can be obtained.

Even if a surface of the single crystal semiconductor substrate has unevenness, the unevenness can be filled with liquid glass by bonding the liquid glass and a solid single crystal semiconductor substrate.

Further, even if a foreign matter is present between the liquid glass and the single crystal semiconductor substrate, the foreign matter can be absorbed into the liquid glass.

DETAILED DESCRIPTION OF THE INVENTION

Embodiment Mode

Figure 1A:
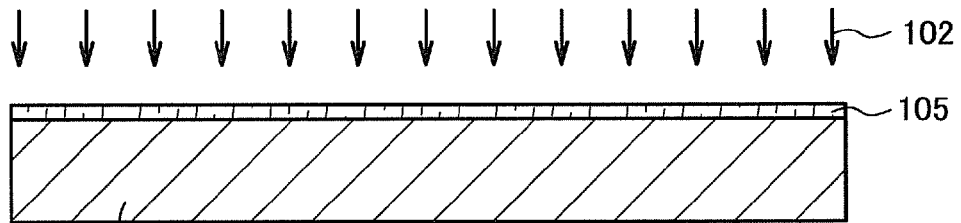
FIGS. 1A to 1F are cross-sectional views illustrating a manufacturing process of a semiconductor device.

Embodiment modes of the present invention disclosed in the present specification will be described below with reference to drawings. However, the present invention disclosed in the present specification can be implemented in various different modes, and it is easily understood by those skilled in the art that various changes and modifications of the modes and details are possible without departing from the purpose and scope of the present invention disclosed in the present specification. Therefore, the present invention disclosed in the present specification is not construed as being limited to the description of the following embodiment modes. Note that the same portion or a portion having the same function is denoted by the same reference numeral in the drawings, and the repetitive explanation thereof is omitted.

Embodiment Mode 1

This embodiment mode is described with reference to FIGS. 1A to 1F.

First, a single crystal semiconductor substrate 101 is prepared. As the single crystal semiconductor substrate 101, a commercially available semiconductor substrate can be used. For example, a single crystal semiconductor substrate formed using a group 14 element, such as a single crystal silicon substrate, a single crystal germanium substrate, or a single crystal silicon germanium substrate, can be used. Alternatively, a compound semiconductor substrate of gallium arsenide, indium phosphide, or the like can be used.

Needless to say, the single crystal semiconductor substrate 101 is not limited to a circular wafer, and various shapes of single crystal semiconductor substrates can be used. For example, a polygonal substrate such as a circular substrate, a rectangular substrate, a pentagonal substrate, or a hexagonal substrate can be used. Needless to say, a commercially available circular single crystal semiconductor wafer can be used as the single crystal semiconductor substrate 101. As a circular single crystal semiconductor wafer, a semiconductor wafer of silicon, germanium, or the like; or a compound semiconductor wafer of gallium arsenide, indium phosphide, or the like can be used.

A typical example of the single crystal semiconductor wafer is a single crystal silicon wafer, and a circular wafer having a diameter of 5 inches (125 mm), a circular wafer having a diameter of 6 inches (150 mm), a circular wafer having a diameter of 8 inches (200 mm), a circular wafer having a diameter of 12 inches (300 mm), a circular wafer having a diameter of 400 mm, or a circular wafer having a diameter of 450 mm can be used. In addition, a rectangular single crystal semiconductor substrate can be formed by cutting a commercially available circular single crystal semiconductor wafer. The substrate can be cut with a cutter such as a dicer or a wire saw; laser cutting; plasma cutting; electron beam cutting; or any other cutting means. In addition, a rectangular single crystal semiconductor substrate can be formed by processing an ingot for manufacturing a semiconductor substrate, which has not been sliced as a substrate yet, into a rectangular solid so that a cross section of the ingot is rectangular and then slicing the rectangular solid ingot.

In addition, although there is no particular limitation on the thickness of the single crystal semiconductor substrate 101, a thicker single crystal semiconductor substrate is preferable because many single crystal semiconductor layers can be formed from one source material wafer, in consideration of reuse of the single crystal semiconductor substrate 101. The thickness of commercially available single crystal silicon wafers conforms to SEMI standards, which specify that, for example, a wafer of 6 inches in diameter is 625 μm thick, a wafer of 8 inches in diameter is 725 μm thick, and a wafer of 12 inches in diameter is 775 μm thick. Note that the thickness of a wafer conforming to SEMI standards has a tolerance of ±25 μm. Needless to say, the thickness of the single crystal semiconductor substrate 101 to be a source material is not limited to that of SEMI standards, and the thickness can be adjusted as appropriate when an ingot is sliced. Needless to say, when a reprocessed single crystal semiconductor substrate 101 is used, the thickness thereof is thinner than that of SEMI standards.

The single crystal semiconductor substrate 101 is made to have a rectangular shape in this embodiment mode. However, the present invention is not limited to this, and various shapes of single crystal semiconductor substrates can be used. For example, a polygonal substrate such as a triangular substrate, a pentagonal substrate, a hexagonal substrate, or the like can be used as well as a rectangular substrate. A commercially available circular semiconductor wafer can also be used as the single crystal semiconductor substrate 101.

The single crystal semiconductor substrate 101 having a rectangular shape can be formed by cutting a commercially available circular bulk single crystal semiconductor substrate. The substrate can be cut with a cutter such as a dicer or a wire saw; laser cutting; plasma cutting; electron beam cutting; or any other cutting means. In addition, the single crystal semiconductor substrate 101 having a rectangular shape can be formed by processing an ingot for manufacturing a semiconductor substrate, which has not been sliced as a substrate yet, into a rectangular solid so that a cross section of the ingot is rectangular and then slicing the rectangular solid ingot.

Note that in the case where a substrate formed using a group 14 element having a diamond structure as a crystal structure, such as a single crystal silicon substrate, is used as the single crystal semiconductor substrate 101, the plane orientation of the main surface may be (100), (110), or (111).

With the use of the single crystal semiconductor substrate 101 having a (110) main surface, atoms are more closely arranged on the main surface than on a surface with different plane orientation; therefore, the flatness of a single crystal semiconductor layer 106 which is formed in a later step is improved. Therefore, a transistor manufactured using the single crystal semiconductor layer 106 having a main surface of (110) has excellent electric characteristics such as a small S value and a high electron field-effect mobility. Note that a single crystal semiconductor substrate having a (110) main surface has advantages over a single crystal semiconductor substrate having a (100) main surface in that it has a high Young's modulus and is likely to be cleaved.

Then, an insulating layer 105 is formed over the single crystal semiconductor substrate 110. The insulating layer 105 can have a single-layer structure or a multilayer structure including two or more layers of any of the films described below. The thickness of the insulating layer 105 can be set in the range of greater than or equal to 5 μm and less than or equal to 400 nm.

As a film for forming the insulating layer 105, an insulating film including silicon or germanium in its composition, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including metal oxide such as aluminum oxide, tantalum oxide, or hafnium oxide; an insulating film including metal nitride such as aluminum nitride; an insulating film including metal oxynitride such as an aluminum oxynitride film; or an insulating film including metal nitride oxide such as an aluminum nitride oxide film can also be used.

Note that a silicon oxynitride film means a film containing more oxygen than nitrogen and, in the case where measurements are performed using Rutherford backscattering spectrometry (RBS) and hydrogen forward scattering (HFS), includes oxygen, nitrogen, Si, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, a silicon nitride oxide film means a film containing more nitrogen than oxygen and, in the case where measurements are performed using RBS and HFS, includes oxygen, nitrogen, Si, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride film or the silicon nitride oxide film is defined as 100 atomic %.

The insulating film for forming the insulating layer 105 can be formed by a CVD method, a sputtering method, a method of oxidizing or nitriding the single crystal semiconductor substrate 101, or the like.

A substrate 114 which is formed in a later step may include impurity elements which decrease reliability of the semiconductor device, such as an alkali metal or an alkaline-earth metal. Therefore, the insulating layer 105 is preferably provided as a film capable of preventing diffusion of such impurity elements from the substrate 114 into the single crystal semiconductor layer 106. The insulating layer 105 may have a single-layer structure or a stacked structure of two or more layers.

As the insulating layer 105, a single-layer film of a silicon nitride film, a silicon nitride oxide film, an aluminum nitride film, an aluminum nitride oxide film, and the like, or a stacked-layer film including any of these films may be formed. By including such a film, the insulating layer 105 can function as a barrier layer.

For example, in the case where the insulating layer 105 is formed as a barrier layer having a single-layer structure, it can be formed with a silicon nitride film, a silicon nitride oxide film, an aluminum nitride film, or an aluminum nitride oxide film with a thickness of greater than or equal to 5 nm and less than or equal to 200 nm.

For example, in the case where the insulating layer 105 has a single-layer structure, the insulating layer 105 is preferably formed using a film which functions as a barrier layer. In this case, the insulating layer 105 having a single-layer structure can be formed using a silicon nitride film, a silicon nitride oxide film, an aluminum nitride film, or an aluminum nitride oxide film having a thickness of greater than or equal to 5 nm and less than or equal to 200 nm.

When the insulating layer 105 is a film having a two-layer structure including one barrier layer, the upper layer is formed using a barrier layer for blocking impurities such as sodium. The upper layer can be formed using a silicon nitride film, a silicon nitride oxide film, an aluminum nitride film, or an aluminum nitride oxide film which has a thickness of 5 nm to 200 nm. These films which function as barrier layers have a high blocking effect for preventing impurity diffusion, but their internal stress is also high. Therefore, as the lower insulating film which is in contact with the single crystal semiconductor substrate 101, a film with an effect of relieving the stress of the upper insulating film is preferably selected. As the insulating film having such an effect, a silicon oxide film, a thermally oxidized film formed by thermal oxidation of the single crystal semiconductor substrate 101, and the like are given. The lower insulating film can be formed to a thickness of greater than or equal to 5 nm and less than or equal to 300 nm.

Alternatively, as the insulating layer 105, an oxide film may be formed by oxidation of a surface of the single crystal semiconductor substrate 101. For example, an oxide film may be formed on the single crystal semiconductor substrate 101 by heating the single crystal semiconductor substrate 101 in a gas including chlorine (Cl) such as a gas including hydrogen chloride (HCl) or a gas including dichloroethylene, for example.

Figure 1B:
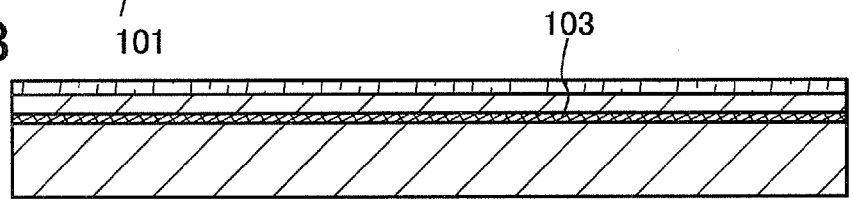

Next, as illustrated in FIG. 1A, the single crystal semiconductor substrate 101 is irradiated with an ion beam 102 including hydrogen ions accelerated by an electric field through the insulating layer 105, whereby a damaged region 103 is formed in a region at a predetermined depth of the single crystal semiconductor substrate 101 from the surface thereof (see FIG. 1B). The ion beam 102 is generated by exciting a source gas, generating plasma of the source gas, and extracting ions contained in the plasma from the plasma under the action of an electric field.

The depth at which the damaged region 103 is formed can be adjusted by the acceleration energy of the ion beam 102 and the incident angle of the ion beam 102. The acceleration energy can be adjusted by acceleration voltage, dose, or the like. The damaged region 103 is formed at the same or substantially the same depth as the average penetration depth of the ions. The thickness of the single crystal semiconductor layer 106 separated from the single crystal semiconductor substrate 101 is determined by the depth to which ions are added. The depth at which the damaged region 103 is formed is adjusted so that the thickness of this single crystal semiconductor layer 106 is greater than or equal to 20 nm and less than or equal to 500 nm, preferably greater than or equal to 20 nm and less than or equal to 200 nm.

For the ion beam irradiation to the single crystal semiconductor substrate 101, an ion doping method without mass separation is employed for the sake of addition of $H_3^+$ ions. An ion doping method without mass separation is preferable in that the cycle time for forming the damaged region 103 in the single crystal semiconductor substrate 101 can be shortened as compared to an ion implantation method with mass separation.

The single crystal semiconductor substrate 101 is carried in a treatment chamber of an ion doping apparatus. Main components of the ion doping apparatus are as follows: a chamber in which an object is disposed; an ion source for generating desired ions; and an acceleration mechanism for acceleration of ions and for irradiation the ions. The ion source includes a gas supply device for supplying a source gas to generate a desired ion species, an electrode for exciting the source gas to generate plasma, and the like. As the electrode for generating plasma, a filament electrode, a capacitive coupling high-frequency discharging electrode, or the like is used.

The acceleration mechanism includes electrodes such as an extraction electrode, an acceleration electrode, a deceleration electrode, and a ground electrode; a power supply for supplying power to these electrodes; and the like. These electrodes that are included in the acceleration mechanism are provided with a plurality of openings or slits, through which ions that are generated from the ion source are accelerated.

Note that the components of the ion doping apparatus are not limited to the above components, and a mechanism is provided as needed. A source gas is excited in the treatment chamber of the ion doping apparatus to generate plasma. Ion species are extracted from this plasma and accelerated to generate the ion beam 102. A plurality of single crystal semiconductor substrates 101 is irradiated with the ion beam 102, whereby ions are added at high concentration to the predetermined depth and the damaged region 103 is formed.

When hydrogen ($H_2$) is used for a source gas, plasma containing $H^+$, $H_2^+$, and $H_3^+$ can be generated by exciting a hydrogen gas. Proportions of ion species generated from a source gas can be changed by controlling an excitation method of plasma, a pressure of an atmosphere for generating plasma, a supply of the source gas, or the like. It is preferable that $H_3^+$ ions be included in plasma so that $H_3^+$ ions account for greater than or equal to 50% of the total amount of $H^+$ ions, $H_2^+$ ions, and $H_3^+$ ions which are ion species. It is more preferable that $H_3^+$ ions be included in plasma so that $H_3^+$ ions account for greater than or equal to 80% of the total amount of $H^+$ ions, $H_2^+$ ions, and $H_3^+$ ions which are ion species.

Therefore, an ion doping apparatus that is an apparatus of non-mass separation type, in which an object arranged in a chamber is irradiated with all of the ion species that are generated such that a process gas is plasma excited, is used. For example, an $H_2$ gas is supplied. In the ion doping apparatus to which an $H_2$ gas is supplied as a plasma source gas, $H_2$ is excited, whereby $H^+$ ions and $H_2^+$ ions which are hydrogen ions are generated. In addition, in the ion doping apparatus, there is a large amount of molecular hydrogen ($H_2$) in a region where plasma is generated, whereby $H_3^+$ can be easily generated in plasma.

It is important that reaction of $H_2 + H^+ \rightarrow H_3^+$ is generated in the generation of $H_3^+$. Accordingly, a probability in which reaction of $H_2 + H^+ \rightarrow H_3^+$ occurs in plasma is increased, whereby the proportion of $H_3^+$ which exists in plasma can be increased. Since it is easy to include a large amount of molecular hydrogen ($H_2$) in plasma in the ion doping apparatus, the probability in which reaction of $H_2 + H^+ \rightarrow H_3^+$ occurs in plasma is increased, and plasma with a high proportion of $H_3^+$ can be generated.

Meanwhile, in an ion implantation method with mass separation, it is difficult to make $H_3^+$ ions account for greater than or equal to 50%, preferably greater than or equal to 80% of the total amount of $H^+$ ions, $H_2^+$ ions, and $H_3^+$ ions. An ion implantation apparatus using an ion implantation method is an apparatus for mass separating ion species in plasma and irradiating an object with an ion species having specific mass, and varies greatly from an ion doping apparatus, which is an apparatus of non-mass separation type. In the ion implantation apparatus, when pressure in a region in which plasma is generated is small and a hydrogen gas is excited to generate $H^+$ ions and $H_2^+$ ions, these ion species are extracted promptly from the region in which plasma is generated. Accordingly, reaction of $H_2 + H^+ \rightarrow H_3^+$ does not easily occur in plasma and the proportion of $H_3^+$ ions generated from the hydrogen gas is extremely low.

Since $H_3^+$ has a larger number of hydrogen atoms than other hydrogen ion species ($H^+$ and $H_2^+$) and $H_3^+$ has thus large mass, in the case of acceleration with the same energy, $H_3^+$ is added to a shallower region in the single crystal semiconductor substrate 101, as compared to the case of $H^+$ and $H_2^+$. Thus, the increase in proportion of $H_3^+$ included in the ion beam 102 leads to lower variation in the average penetration depth of the hydrogen ions; accordingly, in the single crystal semiconductor substrate 101, the hydrogen concentration profile in the depth direction becomes steeper and the peak position of the profile can shift to a shallow region. In addition, when one hydrogen atom is added to the same depth, it can be thought that acceleration voltage of $H_3^+$ ions can be three times as large as acceleration voltage of $H^+$ ions. When the acceleration voltage of ions can be increased, the cycle time for an ion irradiation step can be shortened, and improvement in productivity and throughput can be achieved.

In the case where the ions are added by an ion doping method using a hydrogen gas, the acceleration voltage can be set at higher than or equal to 10 kV and lower than or equal to 200 kV and the dose can be set at higher than or equal to $1 \times 10^{16}$ ions/cm$^2$ and lower than or equal to $6 \times 10^{16}$ ions/cm$^2$. By adding hydrogen ions under the conditions, the damaged region 103 can be formed in a portion of the single crystal semiconductor substrate 101 at a depth of greater than or equal to 50 nm and less than or equal to 500 nm, though it depends on ion species included in the ion beam 102 and percentages thereof.

For example, in the case where the single crystal semiconductor substrate 101 is a single crystal silicon substrate and the insulating layer 105 is a stacked-layer film including a 50-nm-thick silicon oxynitride film and a 50-nm-thick silicon nitride oxide film, the single crystal semiconductor layer 106 with a thickness of about 120 nm can be separated from the single crystal semiconductor substrate 101 under the following conditions: a source gas is hydrogen; the acceleration voltage is 40 kV; and the dose is $2.2 \times 10^{16}$ ions/cm$^2$.

When doping with hydrogen ions is performed under the above conditions except that the insulating layer 105 is a 100-nm-thick silicon oxynitride film, the single crystal semiconductor layer 106 with a thickness of about 70 nm can be separated from the single crystal semiconductor substrate 101.

By local addition of hydrogen ions at high concentration to the single crystal semiconductor substrate 101, the crystal structure is distorted to form minute voids. By heat treatment at comparatively low temperature in a later step, the pressure of a hydrogen gas included in the damaged region 103 is increased and separation occurs along the damaged region 103, whereby the single crystal semiconductor layer 106 can be formed.

Helium (He) can alternatively be used for a source gas of the ion beam 102. Most of ion species generated by excitation of helium is $He^+$; therefore, $He^+$ can be added to the single crystal semiconductor substrate 101 as main ions even by an ion doping method without mass separation. Accordingly, microvoids can be efficiently formed in the damaged region 103 by an ion doping method.

In the case where the ions are added by an ion doping method using helium, the acceleration voltage can be set at higher than or equal to 10 kV and lower than or equal to 200 kV and the dose can be set at higher than or equal to $1 \times 10^{16}$ ions/cm$^2$ and lower than or equal to $6 \times 10^{16}$ ions/cm$^2$.

Argon (Ar) can be used as the source gas of the ion beam 102.

A halogen gas such as a chlorine gas ($Cl_2$ gas) or a fluorine gas ($F_2$ gas) can also be used as the source gas.

In this embodiment mode, description is made on the case of using SmartCut (registered trademark of SOITEC) in which formation of the damaged region 103 makes it possible to separate the single crystal semiconductor layer 106 from the single crystal semiconductor substrate 101. However, any of other bonding methods such as an epitaxial layer transfer (ELTRAN) (registered trademark of Canon Inc.), a dielectric separation method, and a plasma assisted chemical etching (PACE) method may be used to bond the single crystal semiconductor layer 106 and the substrate 114 together.

Alternatively, for example, instead of the damaged region 103, a porous single crystal semiconductor layer may be formed over the single crystal semiconductor substrate 101 provided with no insulating layer 105, and further, instead of the single crystal semiconductor layer 106, a dense single crystal semiconductor layer may be formed over the porous single crystal semiconductor layer by epitaxial growth. The porous single crystal semiconductor layer may be formed by anodically oxidizing the single crystal semiconductor substrate 101.

Figure 1C:
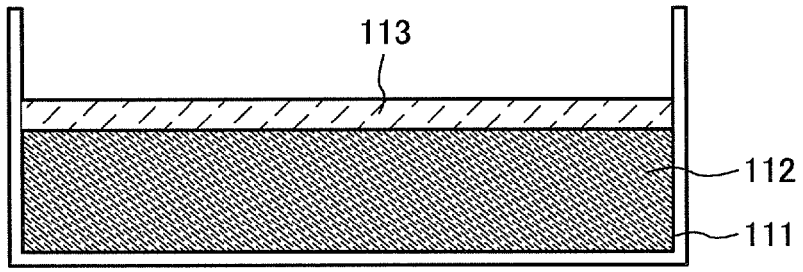

Next, a method for forming the substrate 114 using molten glass is described. As shown in FIG. 1C, a heated liquid denser than liquid glass, for example, molten tin 112 is prepared in a container 111. Then, a high-temperature liquid which contains a component of glass, that is, liquid glass 113 is poured over the molten tin 112 to shape the liquid glass 113 into a plate.

Figure 1D:
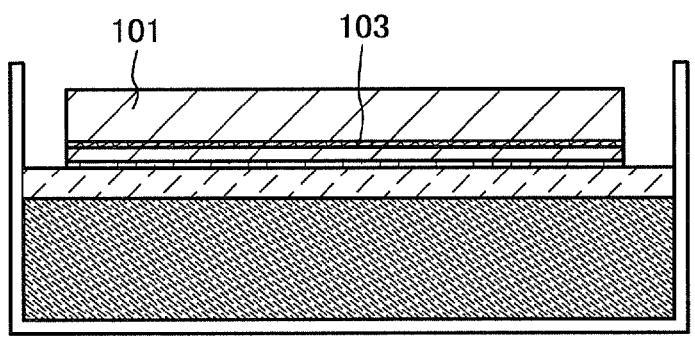

With the temperature of the plate-like liquid glass 113 kept, or with the temperature of the plate-like liquid glass 113 somewhat reduced, the single crystal semiconductor substrate 101 provided with the damaged region 103 is provided over the plate-like liquid glass 113 so that the insulating layer 105 and the liquid glass 113 face each other (see FIG. 1D).

Further, the plate-like liquid glass 113 and the single crystal semiconductor substrate 101 are slowly cooled, whereby the substrate 114 which is a glass substrate is formed concurrently with bonding of the substrate 114 and the single crystal semiconductor substrate 101 together. The bonded substrate 114 and single crystal semiconductor substrate 101 are taken out from the container 111 (see FIG. 1E). After the substrate 114 and the single crystal semiconductor substrate 101 are bonded together concurrently with the formation of the substrate 114, the substrate 114 and the single crystal semiconductor substrate 101 may be further cooled slowly to a temperature low enough for handling them, for example, to room temperature, and then, they may be taken out from the container 111.

The temperature of the molten liquid glass 113 reaches high temperatures of approximately 1500° C. to 1600° C. in general. However, such high temperatures are near the melting point of silicon (1414° C.), and accordingly, bonding performed at such temperatures may affect the crystallinity of silicon. Thus, the bonding is preferably performed with the temperature somewhat reduced, for example, at a temperature lower than or equal to 1414° C. which is the melting point of silicon.

The temperature somewhat lower than the temperature of the molten liquid glass 113 needs to be sufficient for recovery of the crystallinity of the single crystal semiconductor layer 106 which is reduced by addition of hydrogen ions. At this stage, the temperature of the molten liquid glass 113 has already reached approximately 1500° C. to 1600° C. Thus, as compared to the case where heating is performed from room temperature to such high temperatures, a manufacturing cost can be lowered and process time can be shortened.

Further, an entire surface of the single crystal semiconductor substrate 101 is in contact with the liquid glass 113 with the insulating layer 105 interposed therebetween. Therefore, heat from the liquid glass 113 is uniformly conducted to the entire surface of the single crystal semiconductor substrate 101. Accordingly, the crystallinity of the single crystal semiconductor layer 106 is recovered. The temperature of the liquid glass 113 and the single crystal semiconductor substrate 101 at the time of bonding is preferably higher than or equal to 1000° C. and lower than or equal to 1400° C.

In this embodiment mode, the molten tin 112 is used to float the liquid glass 113 thereover. However, instead of the molten glass 112, any liquid may be used as long as it is denser than glass.

Further, in this embodiment mode, the single crystal semiconductor substrate 101 provided with the damaged region 103 is provided over the liquid glass 113. However, the stacking order of the liquid glass 113 and the single crystal semiconductor substrate 101 is not so important. The liquid glass 113 may be poured over the single crystal semiconductor substrate 101 provided with the damaged region 103, and then, the liquid glass 113 may be solidified.

The above-described step is carried out at a high temperature of 1000° C. or higher. Therefore, in the process of operation, the single crystal semiconductor substrate 101 and the single crystal semiconductor layer 106 are separated from each other along the damaged region 103 (see FIG. 1F).

Note that in the case of forming the porous single crystal semiconductor layer, the single crystal semiconductor substrate 101 and the dense single crystal semiconductor layer are separated from each other along the porous single crystal semiconductor layer.

Due to the increase in temperature, the pressure of a hydrogen gas in microvoids formed in the damaged region 103 is increased. Further, due to the increase in pressure, a change occurs in the volume of the microvoids in the damaged region 103 to generate a crack in the damaged region 103. As a result, the single crystal semiconductor substrate 101 is separated along the damaged region 103 to form the single crystal semiconductor layer 106 over the substrate 114 with the insulating layer 105 interposed therebetween.

Further, the single crystal semiconductor substrate 101 which has been separated can be reused for forming another single crystal semiconductor layer 106.

In accordance with this embodiment mode, the single crystal semiconductor layer 106 with a uniform characteristic can be formed over the substrate 114 through a fewer manufacturing steps.

Embodiment Mode 2

This embodiment mode is described with reference to FIGS. 13A to 13D and FIG. 14

First, in accordance with Embodiment Mode 1, steps up to formation of the insulating layer 105 shown in FIG. 1A (see FIG. 13A) and formation of the damaged region 103 shown in FIG. 1B (see FIG. 13B) are carried out.

The single crystal semiconductor substrate 101 provided with the damaged region 103 is placed over a substrate 151 which is a glass substrate so that the substrate 151 and the insulating layer 105 are in contact with each other.

Then, the single crystal semiconductor substrate 101 and the substrate 151 are heated at a temperature of, for example, 300° C. or higher, so that the single crystal semiconductor substrate 101 is bonded to the substrate 151 with the insulating layer 105 interposed therebetween. Alternatively, the heating may be performed at higher temperatures, for example, at approximately 600° C. to separate the single crystal semiconductor substrate 101 in advance.

Subsequently, in the container 111 including a liquid denser than liquid glass, for example, molten tin 112, the substrate 151 is floated over the molten tin 112. The molten tin 112 has already been heated to a temperature at which tin is melted, and in addition, the molten tin 112 is kept at a temperature lower than or equal to the softening point of the substrate 151 which is a glass substrate.

The substrate 151 floated over the molten tin 112 is heated at a temperature higher than or equal to the softening point of the substrate 151. As a result, a factor causing defective bonding, such as a foreign matter which is present between the substrate 151 and the single crystal semiconductor substrate 101, is taken into the substrate 151. In addition, the crystallinity of the single crystal semiconductor layer 106 is recovered.

Note that even when the substrate 151 which is a glass substrate is heated at a temperature higher than or equal to the softening point, the substrate 151 can be kept flat because the substrate 151 is floated over the molten tin 112. However, there is concern that the edge portion of the substrate 151 which is a glass substrate is deformed. In such a case, the area of the substrate 151 may be sufficiently made larger than the single crystal semiconductor substrate 101, so that the deformed edge portion of the substrate 151 is divided after the single crystal semiconductor layer 106 is separated and slow cooling is performed. Further, use of the container 111 which allows the top surface of the substrate 151 and the top surface of the molten tin in the container 111 to have the same area can prevent the edge portion of the substrate 151 which is a glass substrate from being deformed, and thus, the shape of the substrate 151 can be kept.

If bonding is performed and heat treatment is performed in a later step with a micron-size foreign matter present between the substrate 151 and the single crystal semiconductor substrate 101 or at the interface between the substrate 151 and the insulating layer 105, a millimeter-size hole is made in the single crystal semiconductor layer 106.

The micron-size foreign matter includes a particle over the substrate 151 which cannot be removed by washing, a residue of a film formation material over the insulating layer 105 which is generated at the time of forming the insulating layer 105, and the like. Due to the foreign matter, a minute crack is generated in the insulating layer 105 or the like. When treatment by acid is performed after that, the acid penetrates into the minute crack and melts the substrate 151 which is a glass substrate, so that a cavity 108 is generated in the substrate 151.

If the cavity 108 is generated in the substrate 151, in a step of heating by laser irradiation, the air pressure in the cavity is expanded in volume by the heating. By the expanded air pressure, the insulating layer 105 and the single crystal semiconductor layer 106 above the cavity 108 are remove, so that a millimeter-size hole is made (see FIG. 14).

In order to prevent a hole in the single crystal semiconductor layer 106 from being made, the foreign matter between the substrate 151 and the single crystal semiconductor substrate 101 or at the interface between the substrate 151 and the insulating layer 105 may be eliminated.

From the above description, by dissolving the foreign matter in the substrate 151, a hole in the single crystal semiconductor layer 106 can be prevented from being made. In particular, in the case where the insulating layer 105 is formed over the single crystal semiconductor substrate 101, there is concern that a foreign matter is generated in the film formation step. In such a case, it is useful to take the foreign matter into the substrate 151.

Figure 13A:
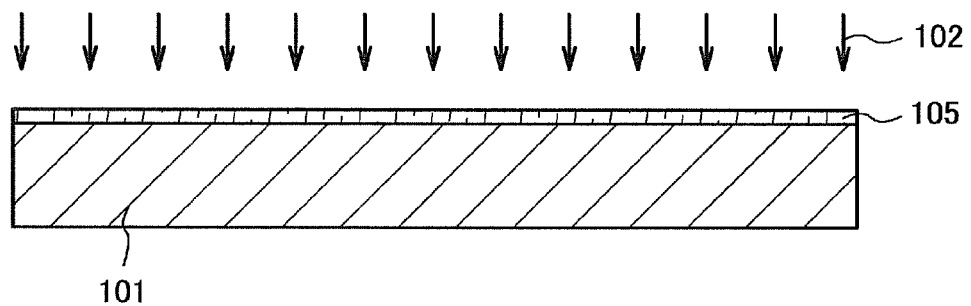
FIGS. 13A to 13D are cross-sectional views illustrating a manufacturing process of a semiconductor device.
Figure 13B:
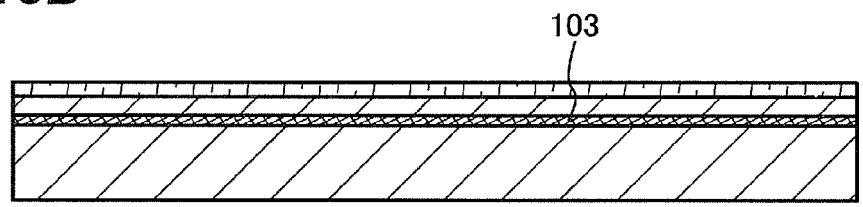
Figure 13C:
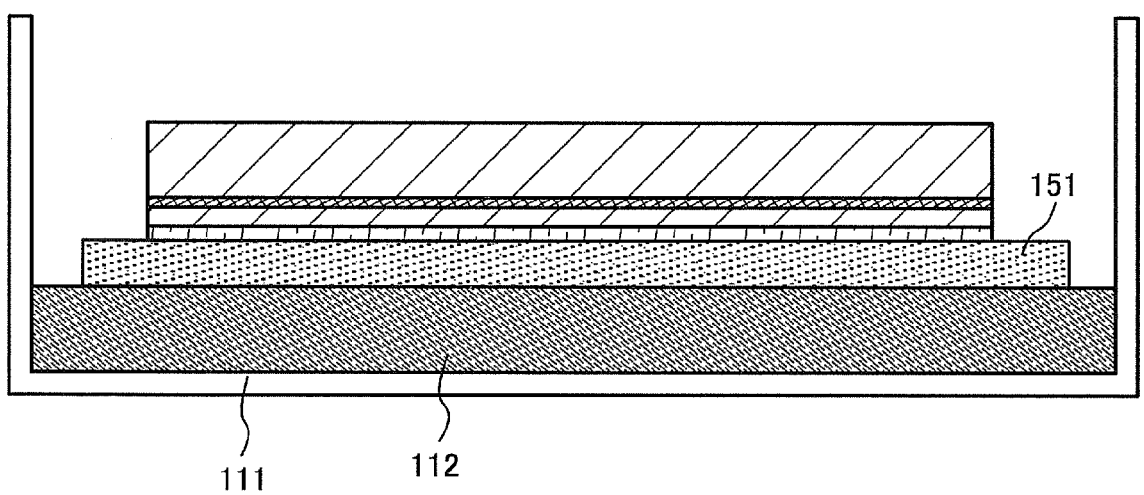
Figure 13D:
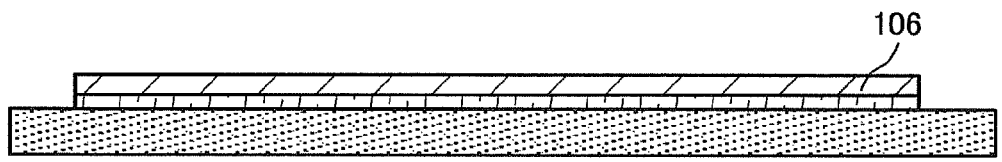
Figure 14:
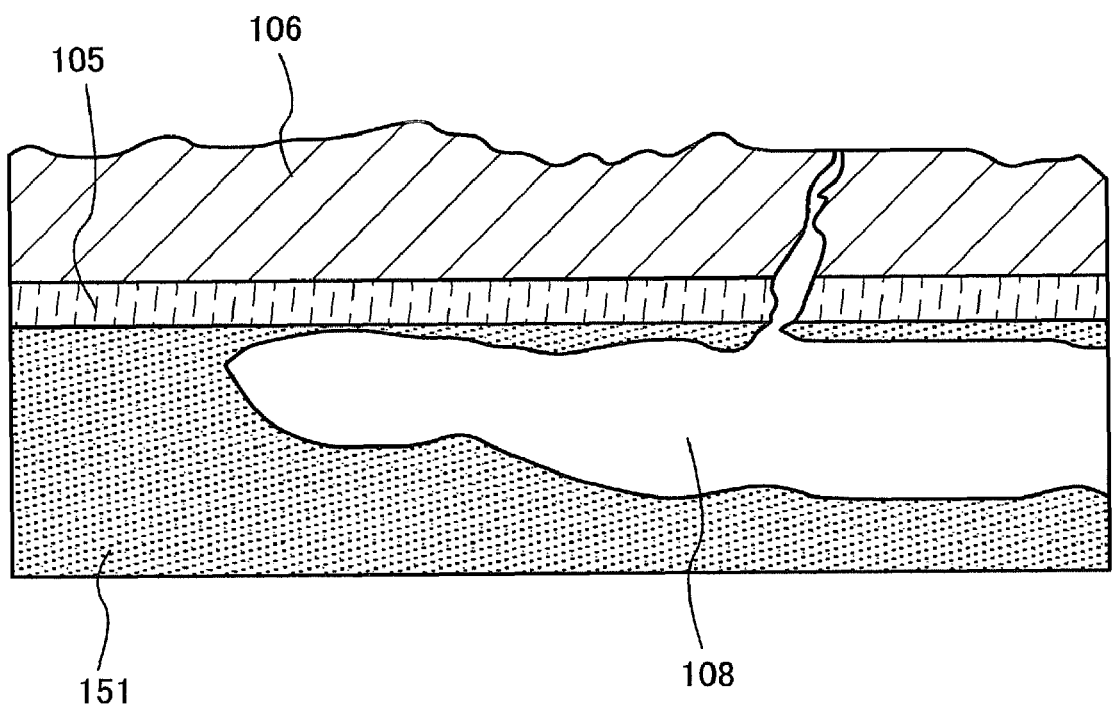
FIG. 14 is a cross-sectional view of a semiconductor device.

By performing heating at a temperature higher than or equal to the softening point of the substrate 151 which is a glass substrate, the single crystal semiconductor substrate 101 and the single crystal semiconductor layer 106 are separated from each other along the damaged region 103 (see FIG. 13D). If the single crystal semiconductor substrate 101 and the single crystal semiconductor layer 106 are not separated from each other in the heating step, separation may be performed by a further heating step or by application of physical force.

Embodiment Mode 3

This embodiment mode is described with reference to FIGS. 2A to 2D and FIGS. 3A to 3D.

Figure 2A:
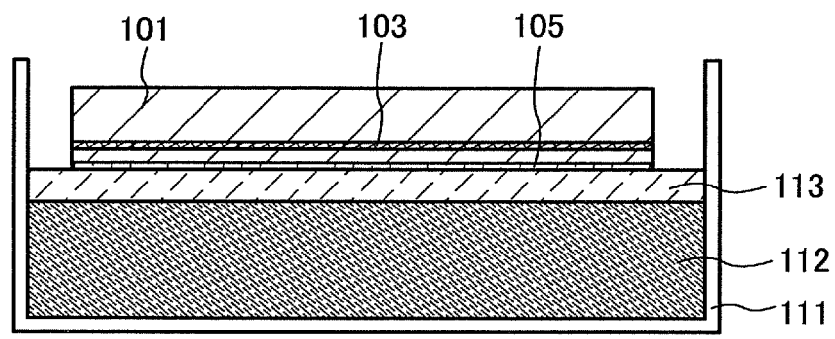
FIGS. 2A to 2D are cross-sectional views illustrating a manufacturing process of a semiconductor device.

First, in accordance with Embodiment Mode 1, a manufacturing process up to FIG. 1D is carried out (see FIG. 2A). Then, the side of the single crystal semiconductor substrate 101 which is opposite to that in contact with the liquid glass 113 with the insulating layer 105 interposed therebetween (in the present specification, the side is referred to as a "reverse side"), that is, the side of the single crystal semiconductor substrate 101 which is opposite to the side where the insulating layer 105 is formed, is provided with a substrate 116 with an adhesive 115 interposed between the single crystal semiconductor substrate 101 and the substrate 116 (see FIG. 2B). Alternatively, the single crystal semiconductor substrate 101 and the substrate 116 may be bonded together by optical contact or the like, instead of using an adhesive. Note that in the present specification, the substrate 116 is also referred to as a substrate supporting portion or a supporting substrate in the sense that the substrate 116 supports the single crystal semiconductor substrate 101.

Figure 2B:
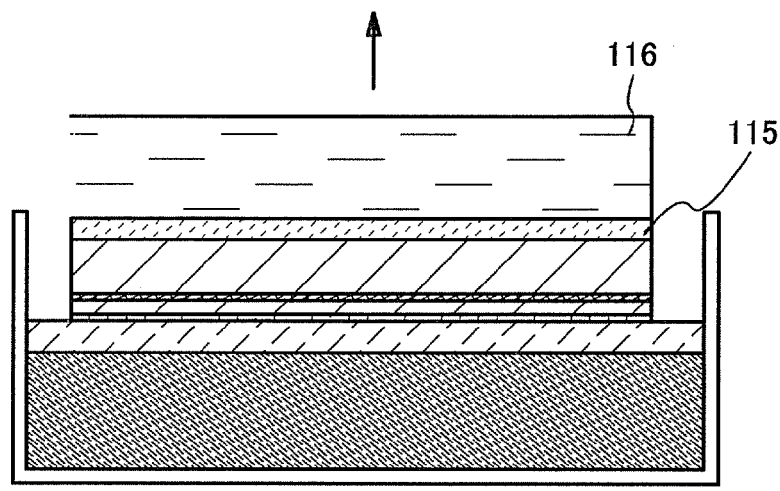

It is acceptable as long as the substrate 116 is formed using a material which is not melted at a temperature in a step of FIG. 2B, for example, at temperatures of 1500° C. to 1600° C. As the substrate 116, a stainless steel substrate, a quartz substrate, and the like are given, for example. The adhesive 115 may be any as long as the single crystal semiconductor substrate 101 and the substrate 116 can be stuck together with the adhesive 115 even at a temperature in the step of FIG. 2B, for example, at temperatures of 1500° C. to 1600° C.

Figure 2C:
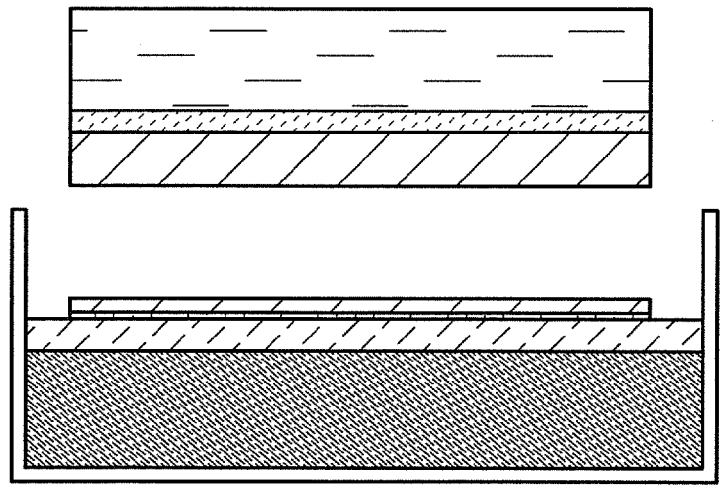

Then, the single crystal semiconductor layer 106 and the single crystal semiconductor substrate 101 are separated from each other along the damaged region 103 (see FIG. 2C). In Embodiment Mode 1, the single crystal semiconductor substrate 101 is separated after the bonded substrate 114 and single crystal semiconductor substrate 101 are taken out from the container 111. However, in this embodiment mode, separation is performed with the single crystal semiconductor substrate 101 put in the container 111. In Embodiment Mode 1, there is concern that, after the separation, the single crystal semiconductor substrate 101 and the single crystal semiconductor layer 106 overlap with each other and a surface of the single crystal semiconductor layer 106 is damaged. However, such damage is not caused in this embodiment mode.

Figure 2D:
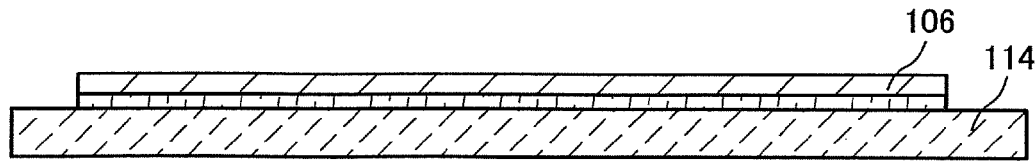

Then, the substrate 114 provided with the single crystal semiconductor layer 106 is taken out from the container 111 (see FIG. 2D).

The single crystal semiconductor substrate 101 may be provided over the liquid glass 113 not in the step shown in FIG. 1D but after the placement of the adhesive 115 and the substrate 116 over the rear surface of the single crystal semiconductor substrate 101. The method is described with reference to FIGS. 3A to 3D.

Figure 3A:
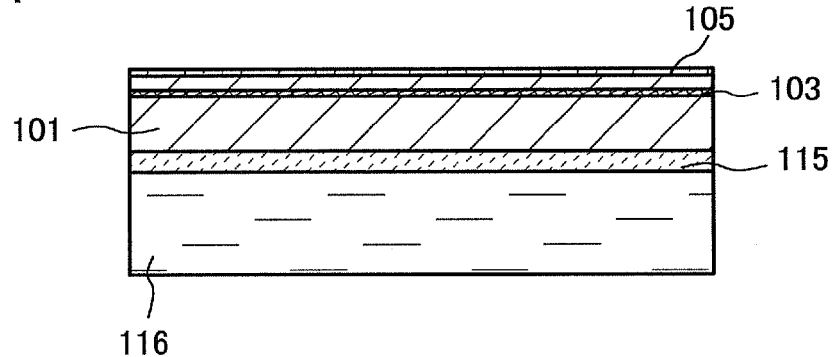
FIGS. 3A to 3D are cross-sectional views illustrating a manufacturing process of a semiconductor device.

First, the substrate 116 is placed over the reverse side of the single crystal semiconductor substrate 101 with the adhesive 115 interposed therebetween (see FIG. 3A).

Figure 3B:
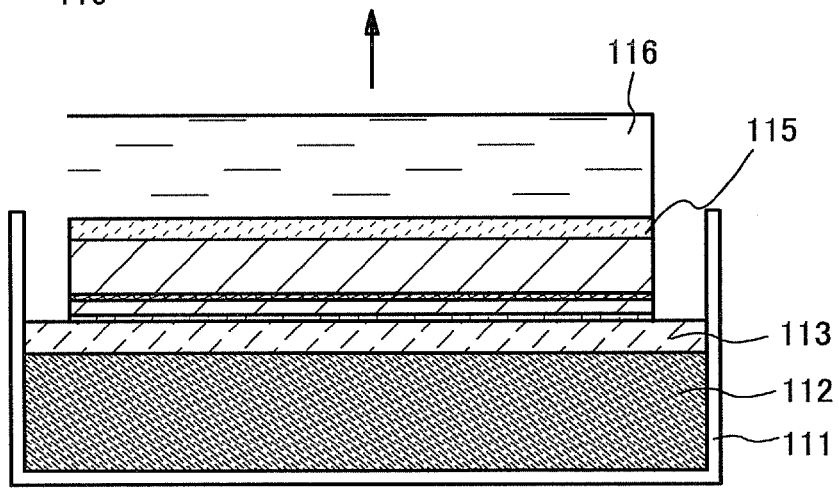
Figure 3C:
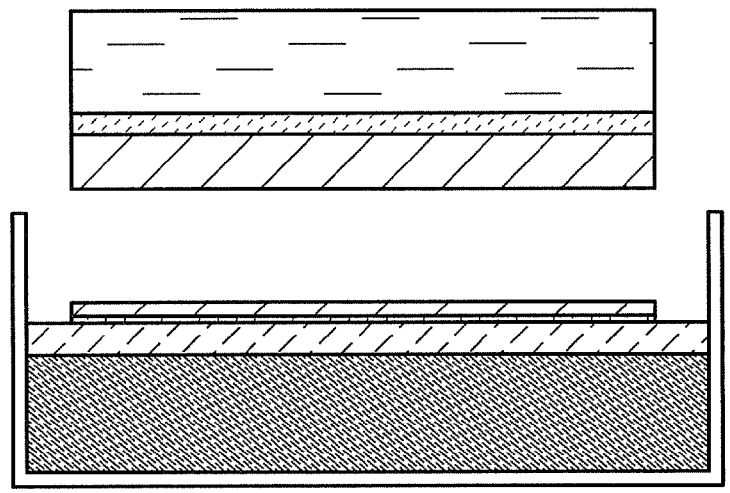
Figure 3D:
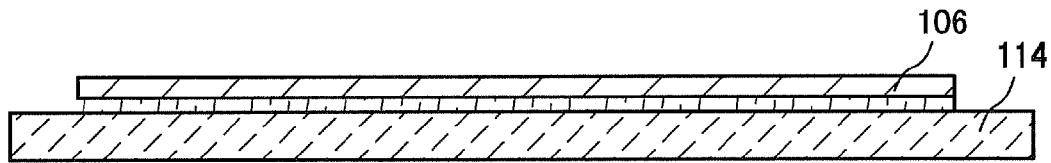

Then, the liquid glass 113 is poured over the molten tin 112, and the single crystal semiconductor substrate 101 in which the substrate 116 is placed over the reverse side is provided over the liquid glass 113 with the insulating layer 105 interposed between the liquid glass 113 and the single crystal semiconductor substrate 101 (see FIG. 3B).

The subsequent steps are carried out in a manner similar to the manufacturing process shown in FIGS. 2C and 2D. The single crystal semiconductor layer 106 and the single crystal semiconductor substrate 101 are separated from each other (see FIG. 3C), and the substrate 114 having the single crystal semiconductor layer 106 is taken out from the container 111 (see FIG. 3D).

In this embodiment mode, the single crystal semiconductor layer 106 having a uniform characteristic can be formed over the substrate 114 in a shorter manufacturing process time.

Embodiment Mode 4

This embodiment mode is described with reference to FIGS. 12A to 12E. In this embodiment mode, a single crystal semiconductor layer can be obtained through a manufacturing process which is different from Embodiment Mode 1.

First, in accordance with Embodiment Mode 1, steps up to formation of the insulating layer 105 shown in FIG. 1A (see FIG. 12A) and formation of the damaged region 103 shown in FIG. 1B (see FIG. 12B) are carried out.

Next, a solid of a liquid material denser than liquid glass, for example, solid tin is provided in the container 111 at room temperature, and further, solid glass is provided over the solid tin. The single crystal semiconductor substrate 101 provided with the damaged region 103 is placed over the solid glass so that the solid glass and the insulating layer 105 are in contact with each other.

With the single crystal semiconductor substrate 101 placed over the solid glass, the temperature of the whole container 111 is raised from room temperature to 1000° C. or higher. The solid tin is melted to become the molten tin 112, and the solid glass becomes the plate-like liquid glass 113 (see FIG. 12C).

Figure 1E:
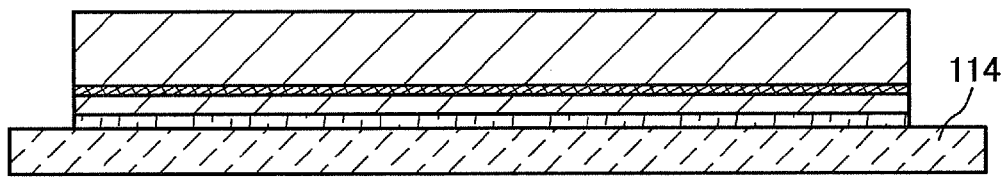
Figure 1F:
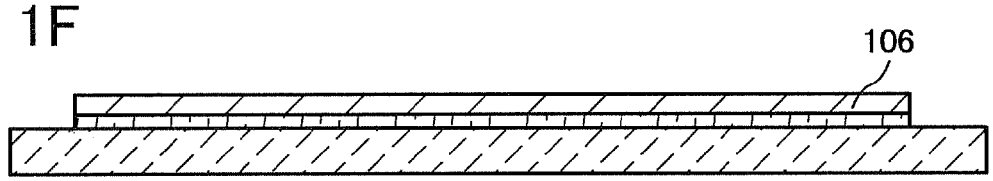

Further, in a manner similar to FIG. 1E, the plate-like liquid glass 113 and the single crystal semiconductor substrate 101 are slowly cooled. By the slow cooling, the substrate 114 which is a glass substrate is formed, and concurrently, the substrate 114 and the single crystal semiconductor substrate 101 are bonded together and taken out from the container 111 (see FIG. 12D).

The above-described process is carried out at a high temperature of 1000° C. or higher. Therefore, in the process of operation, the single crystal semiconductor substrate 101 and the single crystal semiconductor layer 106 are separated from each other along the damaged region 103 (see FIG. 12E).

Embodiment Mode 5

In this embodiment mode, a method for manufacturing a semiconductor device using the single crystal semiconductor layer 106 obtained in accordance with any of Embodiment Modes 1 to 4 is described with reference to FIGS. 4A to 4F and FIGS. 5A to 5D.

Figure 4A:
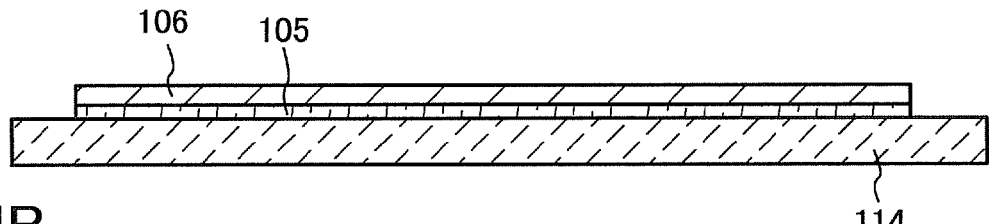
FIGS. 4A to 4F are cross-sectional views illustrating a manufacturing process of a semiconductor device.
Figure 4B:
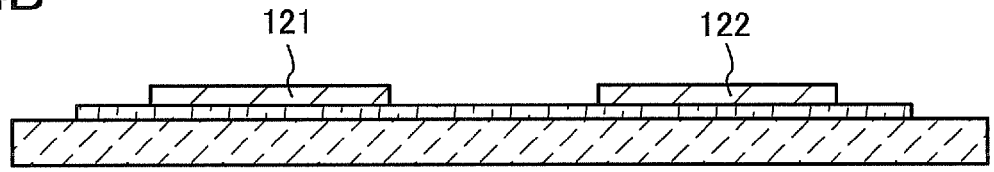
Figure 4C:
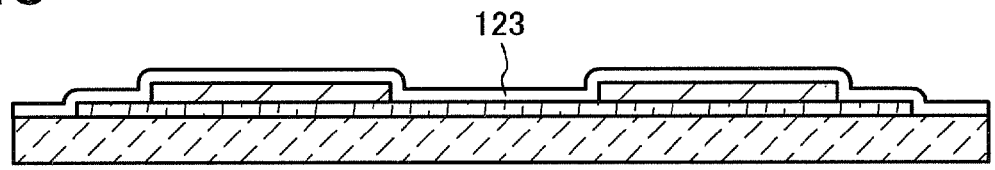

First, in accordance with any of Embodiment Modes 1 to 4, the insulating layer 105 and the single crystal semiconductor layer 106 over the substrate 114 are obtained (see FIG. 4A). Next, the single crystal semiconductor layer 106 over the substrate 114 is etched to form an island-like semiconductor film 121 and an island-like semiconductor film 122 (see FIG. 4B).

To the island-like semiconductor film 121 and the island-like semiconductor film 122, an impurity element imparting p-type conductivity such as boron, aluminum, or gallium, or an impurity element imparting n-type conductivity such as phosphorus or arsenic may be added, in order to control threshold voltage. For example, in the case of adding boron as an impurity element imparting p-type conductivity, boron may be added at a concentration of higher than or equal to $5\times10^{16}$ cm$^{-3}$ and lower than or equal to $1\times10^{17}$ cm$^{-3}$.

The addition of an impurity element for controlling threshold voltage may be performed on the single crystal semiconductor layer 106, or on the island-like semiconductor film 121 and the island-like semiconductor film 122.

Alternatively, the addition of an impurity element for controlling threshold voltage may be performed on the single crystal semiconductor substrate 101 from which the single crystal semiconductor layer 106 has not been separated yet. Further alternatively, the addition of an impurity element may be performed as follows: addition of an impurity element for roughly adjusting threshold voltage is performed on the single crystal semiconductor substrate 101 from which the single crystal semiconductor layer 106 has not been separated yet, and then, addition of an impurity element for finely adjusting threshold voltage is performed on the single crystal semiconductor layer 106 or on the island-like semiconductor film 121 and the island-like semiconductor film 122.

For example, taking as an example the case of using a weak p-type single crystal silicon substrate as the single crystal semiconductor substrate 101, an example of the method for adding an impurity element is described. First, before the single crystal semiconductor layer 106 is etched, boron is added to the entire single crystal semiconductor layer 106. The addition of boron aims at adjustment of the threshold voltage of a p-channel transistor. Using $B_2H_6$ as a dopant gas, boron is added at a concentration of $1\times10^{16}$/cm$^3$ to $1\times10^{17}$/cm$^3$. The concentration of boron is determined in consideration of the activation rate or the like. For example, the concentration of boron can be $6\times10^{16}$/cm$^3$.

Next, the single crystal semiconductor layer 106 is etched to form the island-like semiconductor film 121 and the island-like semiconductor film 122. Then, boron is added to only the island-like semiconductor film 121. The second addition of boron aims at adjustment of the threshold voltage of an n-channel transistor. Using $B_2H_6$ as a dopant gas, boron is added at a concentration of $1\times10^{16}$/cm$^3$ to $1\times10^{17}$/cm$^3$. For example, the concentration of boron can be $6\times10^{16}$/cm$^3$.

Note that in the case where a substrate having a conductivity type and resistance which are suitable for the threshold voltage of either the p-channel transistor or the n-channel transistor can be used as the single crystal semiconductor substrate 101, the required number of steps for adding an impurity element for controlling the threshold voltage can be one, and at that time, an impurity element may be added to one of the island-like semiconductor films 121 and 122 in order to control the threshold voltage.

Next, a gate insulating film 123 is formed to cover the island-like semiconductor film 121 and the island-like semiconductor film 122. The gate insulating film 123 may be formed using a single layer or a stack of a film including silicon oxide, silicon nitride oxide, silicon nitride, hafnium oxide, aluminum oxide, or tantalum oxide by a PECVD method, a sputtering method, or the like.

In this embodiment mode, the gate insulating film 123 can be formed to a small thickness, for example, to a thickness of 20 nm to cover the surfaces of the island-like semiconductor films 121 and 122 by a PECVD method.

Alternatively, the gate insulating film 123 may be formed by oxidation or nitridation of the surfaces of the island-like semiconductor films 121 and 122 by a high-density plasma treatment. The high-density plasma treatment is performed using, for example, a mixed gas of a rare gas such as He, Ar, Kr, or Xe and oxygen, nitrogen oxide, ammonia, nitrogen, hydrogen, or the like. In this case, when excitation of the plasma is performed by introduction of a microwave, high-density plasma with a low electron temperature can be generated.

The surfaces of the island-like semiconductor films 121 and 122 are oxidized or nitrided by oxygen radicals (OH radicals may be included) or nitrogen radicals (NH radicals may be included) which are generated by such high-density plasma, whereby an insulating film is formed to a thickness of 1 nm to 50 nm, preferably 5 nm to 30 nm over each of the island-like semiconductor films 121 and 122.

The gate insulating film 123 may be formed by thermal oxidation of the island-like semiconductor film 121 and the island-like semiconductor film 122. In that case, the gate insulating film 123 is formed over each of the island-like semiconductor films 121 and 122.

Further, after the gate insulating film 123 containing hydrogen is formed, hydrogen contained in the gate insulating film 123 may be diffused into the island-like semiconductor film 121 and the island-like semiconductor film 122 by heat treatment at a temperature of higher than or equal to 350° C. and lower than or equal to 450° C. In this case, the gate insulating film 123 can be formed by deposition of silicon nitride or silicon nitride oxide at a process temperature of lower than or equal to 350° C. by a PECVD method.

Hydrogen is supplied to the island-like semiconductor film 121 and the island-like semiconductor film 122, whereby a crystal defect to serve as a charge trapping center can be reduced effectively in the island-like semiconductor film 121 and the island-like semiconductor film 122 and at the interface between the gate insulating film 123 and the island-like semiconductor films 121 and 122.

Figure 4D:
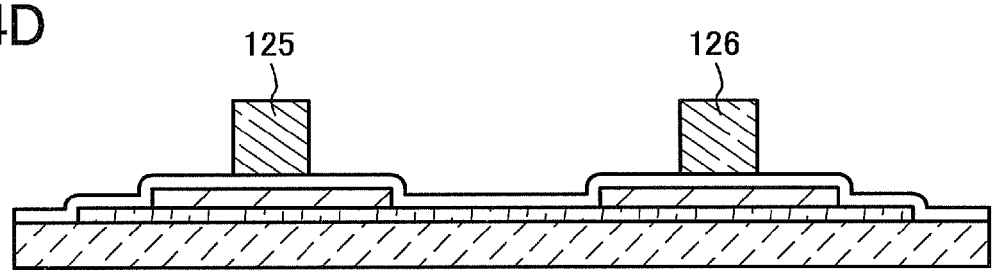
Figure 4E:
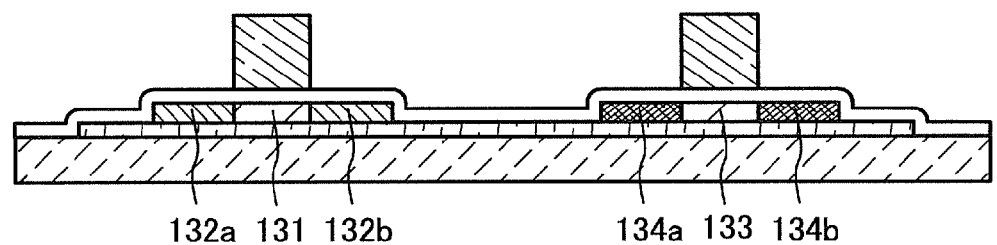
Figure 4F:
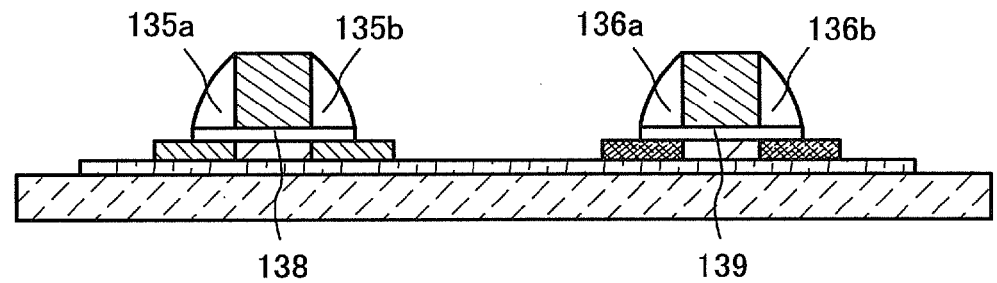

Then, after a conductive film is formed over the gate insulating film 123, the conductive film is etched, whereby a gate electrode 125 and a gate electrode 126 are formed above the island-like semiconductor film 121 and the island-like semiconductor film 122, respectively (see FIG. 4D).

The conductive film to be the gate electrode 125 and the gate electrode 126 can be formed by a CVD method, a sputtering method, or the like. For the conductive film, tantalum (Ta), tungsten (W), titanium (Ti), molybdenum (Mo), aluminum (Al), copper (Cu), chromium (Cr), niobium (Nb), or the like may be used. Alternatively, an alloy containing any of the above metals as its main component or a compound containing any of the above metals may be used. Further alternatively, the conductive film may be formed using a semiconductor such as polycrystalline silicon to which an impurity element imparting conductivity, such as phosphorus, is added to a semiconductor film.

Although each of the gate electrodes 125 and 126 is formed using a single layer conductive film in this embodiment mode, this embodiment mode is not limited to this structure. Each of the gate electrodes 125 and 126 may be formed by stacking plural conductive films. In the case of a stacked structure in which three or more conductive films are stacked, a stacked structure of a molybdenum film, an aluminum film, and a molybdenum film may be employed.

For example, in the case where each of the gate electrodes 125 and 126 is formed using a stack of two conductive films, as a combination of the two conductive films, tantalum nitride or tantalum (Ta) can be used for a first layer, and tungsten (W) can be used for a second layer. Besides, the following combinations are given: tungsten nitride and tungsten, molybdenum nitride and molybdenum, aluminum and tantalum, aluminum and titanium, and the like. Since tungsten and tantalum nitride have high heat resistance, heat treatment aimed at thermal activation can be performed in a later step after forming the two conductive films. Alternatively, as a combination of the two conductive films, for example, silicon doped with an impurity imparting n-type conductivity and nickel silicide, Si doped with an impurity imparting n-type conductivity and $WSi_x$, or the like can be used.

As masks used for forming the gate electrode 125 and the gate electrode 126, instead of resist, silicon oxide, silicon nitride oxide, or the like may be used. Although, a step of etching silicon oxide, silicon nitride oxide, or the like is added in this case, the reduction in film thickness of the masks at the time of etching is less than that in the case of using resist. Accordingly, the gate electrodes 125 and 126 each having a desired width can be formed. Alternatively, the gate electrode 125 and the gate electrode 126 may be selectively formed by a droplet discharge method without using the masks.

Note that, a droplet discharge method means a method in which droplets containing a predetermined composition are discharged or ejected from fine pores to form a predetermined pattern, and includes an ink-jet method and the like.

After the conductive film is formed, the gate electrode 125 and the gate electrode 126 are subjected to an inductively coupled plasma (ICP) etching method. The conductive film can be etched into a desired tapered shape by, as appropriate, controlling the etching condition (e.g., the amount of electric power applied to a coiled electrode layer, the amount of electric power applied to an electrode layer on the substrate side, or the electrode temperature on the substrate side). Further, angles and the like of the taper shapes can also be controlled by the shape of the masks. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Next, an impurity element imparting one conductivity type is added to the island-like semiconductor film 121 and the island-like semiconductor film 122 with the use of the gate electrode 125 and the gate electrode 126 as masks. In this embodiment mode, an impurity element imparting n-type conductivity (e.g., phosphorus or arsenic) is added to the island-like semiconductor film 121, and an impurity element imparting p-type conductivity (e.g., boron) is added to the island-like semiconductor film 122.

Note that when the impurity element imparting n-type conductivity is added to the island-like semiconductor film 121, the island-like semiconductor film 122 is covered with a mask or the like so that the impurity element imparting n-type conductivity is not added to the island-like semiconductor film 122. On the other hand, when the impurity element imparting p-type conductivity is added to the island-like semiconductor film 122, the island-like semiconductor film 121 is covered with a mask or the like so that the impurity element imparting p-type conductivity is not added to the island-like semiconductor film 121.

Alternatively, after an impurity element imparting one of p-type and n-type conductivity is added to the island-like semiconductor film 121 and the island-like semiconductor film 122, an impurity element imparting the other conductivity may be added to one of the island-like semiconductor films 121 and 122 selectively at higher concentration than the previously added impurity element.

By this step of adding an impurity element, an n-type low-concentration impurity region 132a and an n-type low-concentration impurity region 132b are formed in the island-like semiconductor film 121 and a p-type high-concentration impurity region 134a and a p-type high-concentration impurity region 134b are formed in the island-like semiconductor film 122. In the island-like semiconductor film 121, a region which overlaps with the gate electrode 125 is to be a channel formation region 131. In the island-like semiconductor film 122, a region which overlaps with the gate electrode 126 is to be a channel formation region 133 (see FIG. 4E).

Next, a sidewall 135a and a sidewall 135b are formed on side surfaces of the gate electrode 125, and a sidewall 136a and a sidewall 136b are formed on side surfaces of the gate electrode 126.

For example, the sidewalls 135a and 135b and the sidewalls 136a and 136b can be formed in such a manner that an insulating film is newly formed so as to cover the gate insulating film 123 and the gate electrodes 125 and 126 and the newly formed insulating film is partially etched by anisotropic etching in which etching is performed mainly in a perpendicular direction.

The newly formed insulating film is partially etched by the above anisotropic etching, whereby the sidewalls 135a and 135b are formed on the side surfaces of the gate electrode 125 and the sidewalls 136a and 136b are formed on the side surfaces of the gate electrode 126. Note that the gate insulating film 123 is also partially etched by this anisotropic etching, whereby a gate insulating film 138 is formed below the gate electrode 125 and the sidewalls 135a and 135b and a gate insulating film 139 is formed below the gate electrode 126 and the sidewalls 136a and 136b (see FIG. 4F).

The insulating film for forming the sidewalls 135a and 135b and the sidewalls 136a and 136b can be formed as a single layer or a stack of two or more layers of a silicon film, a silicon oxide film, a silicon nitride oxide film, or a film including an organic material such as an organic resin by a PECVD method, a sputtering method, or the like. In this embodiment mode, the insulating film is formed using a silicon oxide film having a thickness of 100 nm by a PECVD method. In addition, as an etching gas of the silicon oxide film, a mixed gas of $CHF_3$ and helium can be used. Note that the steps of forming the sidewalls 135a and 135b and the sidewalls 136a and 136b are not limited to the steps given here.

Next, an impurity element imparting n-type conductivity is added to the island-like semiconductor film 121 with the use of the gate electrode 125 and the sidewalls 135a and 135b as masks. In this step, the impurity element imparting n-type conductivity is added to the island-like semiconductor film 121 while the island-like semiconductor film 122 is covered with a mask or the like.

Figure 5A:
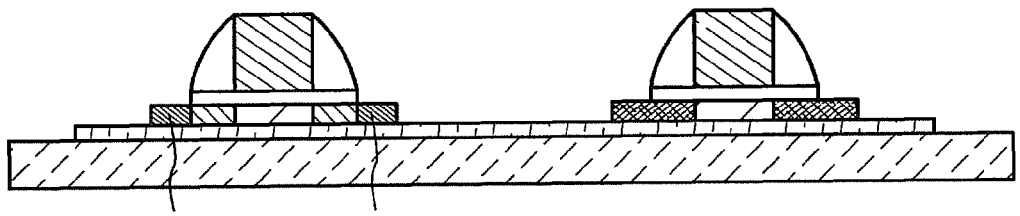
FIGS. 5A to 5D are cross-sectional views illustrating a manufacturing process of a semiconductor device.

By the above addition of the impurity element, a pair of n-type high-concentration impurity regions 141a and 141b is formed in the island-like semiconductor film 121 in a self-alignment manner (see FIG. 5A).

Then, the mask covering the island-like semiconductor film 122 is removed, and then, heat treatment is performed to activate the impurity element imparting n-type conductivity added to the island-like semiconductor film 121 and the impurity element imparting p-type conductivity added to the island-like semiconductor film 122.

In the island-like semiconductor film 121, the channel formation region 131, the low-concentration impurity regions 132a and 132b, and the high-concentration impurity regions 141a and 141b which are source and drain regions are formed. Over the island-like semiconductor film 121, the gate insulating film 138 is formed, and over the gate insulating film 138, the gate electrode 125, the sidewall 135a, and the sidewall 135b are formed.

In the island-like semiconductor film 122, the channel formation region 133 and the high-concentration impurity regions 134a and 134b which are source and drain regions are formed. Over the island-like semiconductor film 122, the gate insulating film 139 is formed, and over the gate insulating film 139, the gate electrode 126, the sidewall 136a, and the sidewall 136b are formed.

Note that the sidewalls 135a and 135b and the sidewalls 136a and 136b do not need to be formed if there is no necessity. In this case, the addition of an impurity element imparting one conductivity type for forming the high-concentration impurity region 141a and the high-concentration impurity region 141b may be performed using resist masks instead of the sidewall 135a and the sidewall 135b, and the resist masks may be removed after the addition of an impurity element.

In the case where the sidewalls 135a and 135b and the sidewalls 136a and 136b are not formed, the gate insulating film 123 is not etched. Thus, the gate insulating film 123 may cover the island-like semiconductor film 121 and the island-like semiconductor film 122.

In order to reduce the resistance of the source and drain regions, a silicide layer may be formed by siliciding the high-concentration impurity region 141a and the high-concentration impurity region 141b in the island-like semiconductor film 121 and the high-concentration impurity region 134a and the high-concentration impurity region 134b in the island-like semiconductor film 122.

The siliciding may be performed by placing a metal in contact with the island-like semiconductor film 121 and the island-like semiconductor film 122 and making the metal react with silicon in the island-like semiconductor film 121 and the island-like semiconductor film 122 through heat treatment so as to generate a silicide compound.

As the metal, cobalt or nickel is preferable, and the following can be used: titanium (Ti), tungsten (W), molybdenum (Mo), zirconium (Zr), hafnium (Hf), tantalum (Ta), vanadium (V), neodymium (Nd), chromium (Cr), platinum (Pt), palladium (Pd), or the like. The silicide reaction may occur in the surfaces of the island-like semiconductor films 121 and 122, and in the case where the thicknesses of the island-like semiconductor film 121 and the island-like semiconductor film 122 are small, the silicide reaction may proceed to the bottoms of the island-like semiconductor films 121 and 122. As the heat treatment for siliciding, a resistive heating furnace, an RTA apparatus, a microwave heating apparatus, or a laser irradiation apparatus can be used.

Next, an interlayer insulating film 142 is formed to cover the island-like semiconductor films 121 and 122, the gate electrodes 125 and 126, the sidewalls 135a and 135b, and the sidewalls 136a and 136b.

As the interlayer insulating film 142, an insulating film containing hydrogen is formed. In this embodiment mode, as the interlayer insulating film 142, a silicon nitride oxide film having a thickness of about 600 nm is formed by a PECVD method using a source gas including monosilane, ammonia, and $N_2O$.

The interlayer insulating film 142 is made to contain hydrogen to diffuse hydrogen from the interlayer insulating film 142 so that dangling bonds in the island-like semiconductor film 121 and the island-like semiconductor film 122 can be terminated. The formation of the interlayer insulating film 142 can prevent impurities such as an alkali metal and an alkaline earth metal from penetrating the island-like semiconductor films 121 and 122. Specifically, silicon nitride, silicon nitride oxide, aluminum nitride, aluminum oxide, silicon oxide, or the like is used for the interlayer insulating film 142.

Figure 5B:
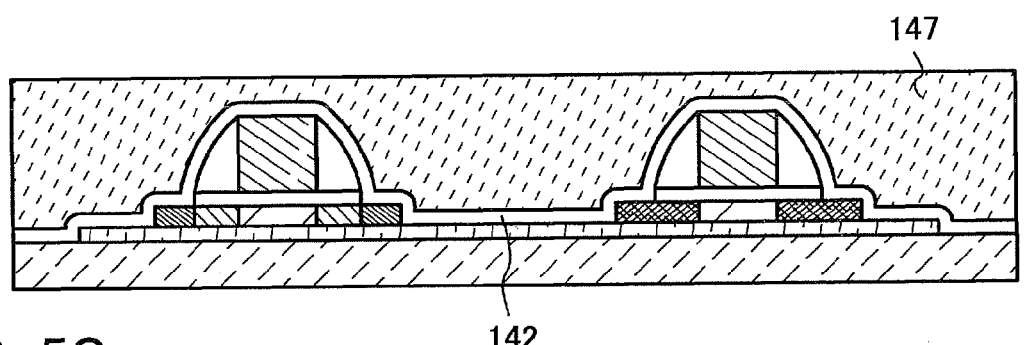

Next, an interlayer insulating film 147 is formed over the interlayer insulating film 142 (see FIG. 5B). An organic material having heat resistance, such as polyimide, acrylic, benzocyclobutene, polyamide, or epoxy can be used for the interlayer insulating film 147. In addition to such organic materials, it is also possible to use a low-dielectric constant material (a low-k material), a siloxane-based resin, silicon oxide, silicon nitride, silicon nitride oxide, phosphosilicate glass (PSG), borophosphosilicate glass (BPSG), alumina, or the like. A siloxane-based resin may include as a substituent at least one of fluorine, an alkyl group, and an aryl group, as well as hydrogen. Alternatively, the interlayer insulating film 147 may be formed by stacking plural insulating films formed using any of these materials.

Note that the siloxane-based resin corresponds to a resin including a Si—O—Si bond formed using a siloxane-based material as a starting material. The siloxane-based resin may include as a substituent at least one of fluorine, an alkyl group, and aromatic hydrocarbon, as well as hydrogen.

For the formation of the interlayer insulating film 147, the following method can be used depending on the material of the interlayer insulating film 147: a CVD method, a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like.

Next, heat treatment at a temperature of about 400° C. to 450° C. (e.g., 410° C.) is performed in a nitrogen atmosphere for about 1 hour, so that hydrogen is made to diffuse from the interlayer insulating film 142 and dangling bonds in the island-like semiconductor films 121 and 122 are terminated with hydrogen. Since the single crystal semiconductor layer 106 has a much lower defect density than a polycrystalline silicon film which is formed by crystallizing an amorphous silicon film, this termination treatment with hydrogen can be performed in short time.

Next, contact holes are formed in the interlayer insulating film 142 and the interlayer insulating film 147 so that the high-concentration impurity regions 141a and 141b in the island-like semiconductor film 121 and the high-concentration impurity regions 134a and 134b in the island-like semiconductor film 122 are partially exposed. The formation of the contact holes can be performed by a dry etching method using a mixed gas of $CHF_3$ and He; however, the present invention is not limited to this.

Then, an electrode 143a and an electrode 143b are formed in contact with the high-concentration impurity region 141a and the high-concentration impurity region 141b through the contact holes, respectively, and an electrode 144a and an electrode 144b are formed in contact with the high-concentration impurity region 134a and the high-concentration impurity region 134b through the contact holes, respectively. The high-concentration impurity region 141a and the high-concentration impurity region 141b are present in the island-like semiconductor film 121, and the high-concentration impurity region 134a and the high-concentration impurity region 134b are present in the island-like semiconductor film 122.

Figure 5C:
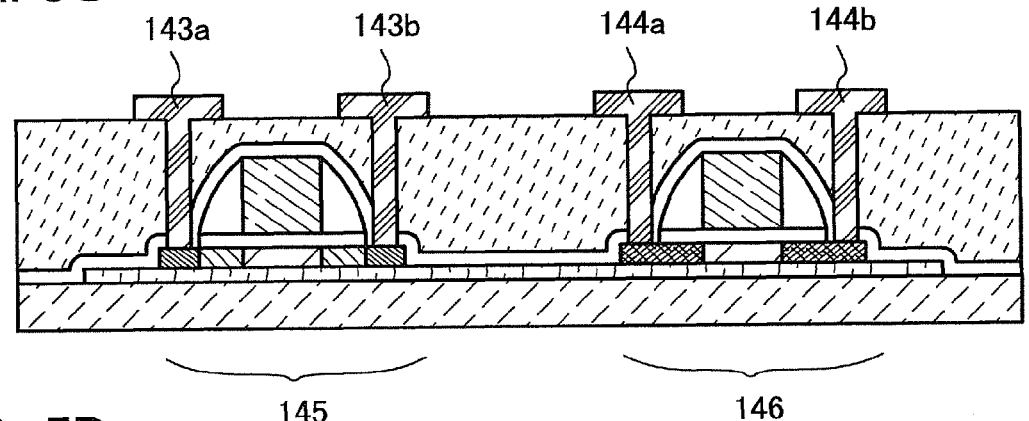

Through the above-described process, an n-channel transistor 145 including the island-like semiconductor film 121, the gate insulating film 138, the gate electrode 125, the sidewalls 135a and 135b, and the electrodes 143a and 143b is formed, and a p-channel transistor 146 including the island-like semiconductor film 122, the gate insulating film 139, the gate electrode 126, the sidewalls 136a and 136b, and the electrodes 144a and 144b is formed (see FIG. 5C).

The electrodes 143a and 143b and the electrodes 144a and 144b can be formed by a CVD method, a sputtering method, or the like. Specifically, the electrodes 143a and 143b and the electrodes 144a and 144b can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above metal as its main component or a compound containing the above metal may be used. The electrodes 143a and 143b and the electrodes 144a and 144b can be formed using a single layer or a stack of a plurality of films formed using the above metal.

As an example of an alloy containing aluminum as its main component, an alloy containing aluminum as its main component and also containing nickel is given. Further, an alloy which contains aluminum as its main component and contains nickel and one of or both carbon and silicon can also be given. Since aluminum and aluminum silicon have low resistance and are inexpensive, aluminum and aluminum silicon are suitable as materials for forming the electrodes 143a and 143b and the electrodes 144a and 144b.

In particular, in the case where the shape of an aluminum silicon (Al—Si) film is processed by etching, generation of hillocks in resist baking for forming an etching mask can be prevented as compared to the case of using an aluminum film. Instead of silicon (Si), Cu may be mixed into an aluminum film at about 0.5%.

For example, a stacked structure including a barrier film, an aluminum silicon (Al—Si) film, and a barrier film or a stacked structure including a barrier film, an aluminum silicon (Al—Si) film, a titanium nitride film, and a barrier film may be used as the electrodes 143a and 143b and the electrodes 144a and 144b. Note that the barrier film refers to a film formed using titanium, a nitride of titanium, molybdenum, or a nitride of molybdenum. When barrier films are formed to sandwich an aluminum silicon (Al—Si) film therebetween, generation of hillocks of aluminum or aluminum silicon can be further prevented.

Moreover, when the barrier film is formed using titanium that is a highly reducible element, even if a thin oxide film is formed over the island-like semiconductor film 121 and the island-like semiconductor film 122, the oxide film is reduced by the titanium contained in the barrier film, whereby preferable contact between the electrode 143a and 143b and the island-like semiconductor film 121 and between the electrodes 144a and 144b and the island-like semiconductor film 122 can be obtained.

Further, a plurality of barrier films may be stacked to be used. In that case, for example, a five-layer structure in which Ti, titanium nitride, Al—Si, Ti, and titanium nitride are stacked from the lowest layer can be used as the electrodes 143a and 143b and the electrodes 144a and 144b.

For the electrodes 143a and 143b and the electrodes 144a and 144b, tungsten silicide formed by a chemical vapor deposition method using a $WF_6$ gas and a $SiH_4$ gas may be used. Alternatively, tungsten formed by hydrogen reduction of $WF_6$ may be used for the electrodes 143a and 143b and the electrodes 144a and 144b.

In this embodiment mode, the case is described as an example in which the n-channel transistor 145 and the p-channel transistor 146 have one gate electrode 125 and one gate electrode 126, respectively. However, the present invention disclosed in the present specification is not limited to this structure. A transistor manufactured in accordance with the present invention disclosed in the present specification can be a transistor with a multi-gate structure in which a plurality of electrodes which functions as gates is included and the plurality of electrodes is electrically connected to one another. Moreover, the transistor may have a planar structure.

Figure 5D:
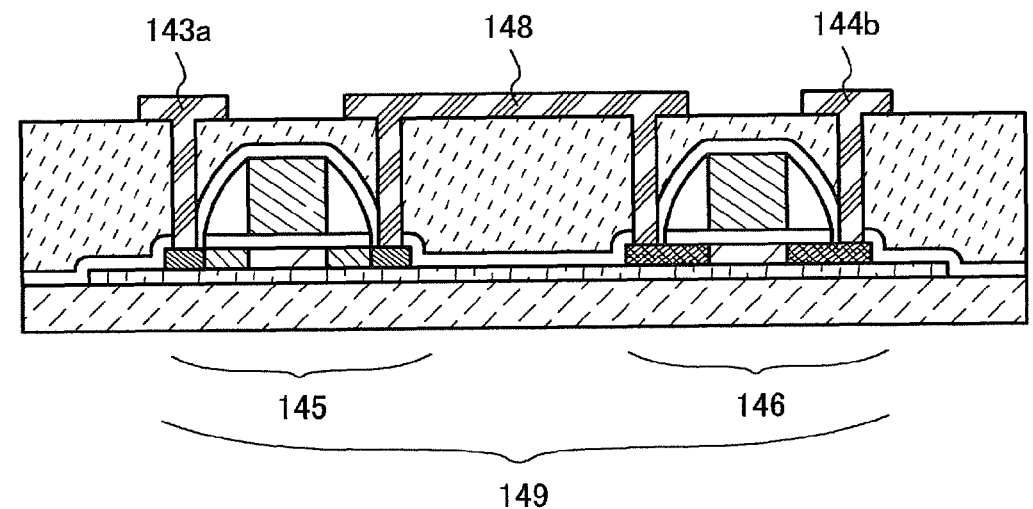

The electrode 143b of the n-channel transistor 145 and the electrode 144a of the p-channel transistor 146 may be connected to each other to serve as an electrode 148, so that the n-channel transistor 145 and the p-channel transistor 146 collectively serve as a CMOS circuit 149 (see FIG. 5D). The CMOS circuit 149 can be used for various driver circuits and processing circuits.

Note that since a single crystal semiconductor layer of the present invention disclosed in the present specification is a sliced layer of a single crystal semiconductor substrate, its orientation does not vary. Therefore, variation in electric characteristics such as threshold voltage and mobility of a plurality of transistors manufactured using a single crystal semiconductor layer can be made small. Further, since there are almost no crystal grain boundaries, a leakage current due to a crystal grain boundary can be suppressed, and power saving of a semiconductor device can be realized. Accordingly, a highly reliable semiconductor device can be manufactured.

Embodiment Mode 6

This embodiment mode is described with reference to FIG. 6, FIG. 7, FIGS. 8A and 8B, FIGS. 9A and 9B, FIGS. 10A to 10C, and FIGS. 11A to 11C. In this embodiment mode, an example is described in which transistors or CMOS circuits are applied to various semiconductor devices. In the example, the transistors and the CMOS circuits are obtained by application of the single crystal semiconductor layers formed in accordance with Embodiment Modes 1 to 4 to the content disclosed in Embodiment Mode 5.

Figure 6:
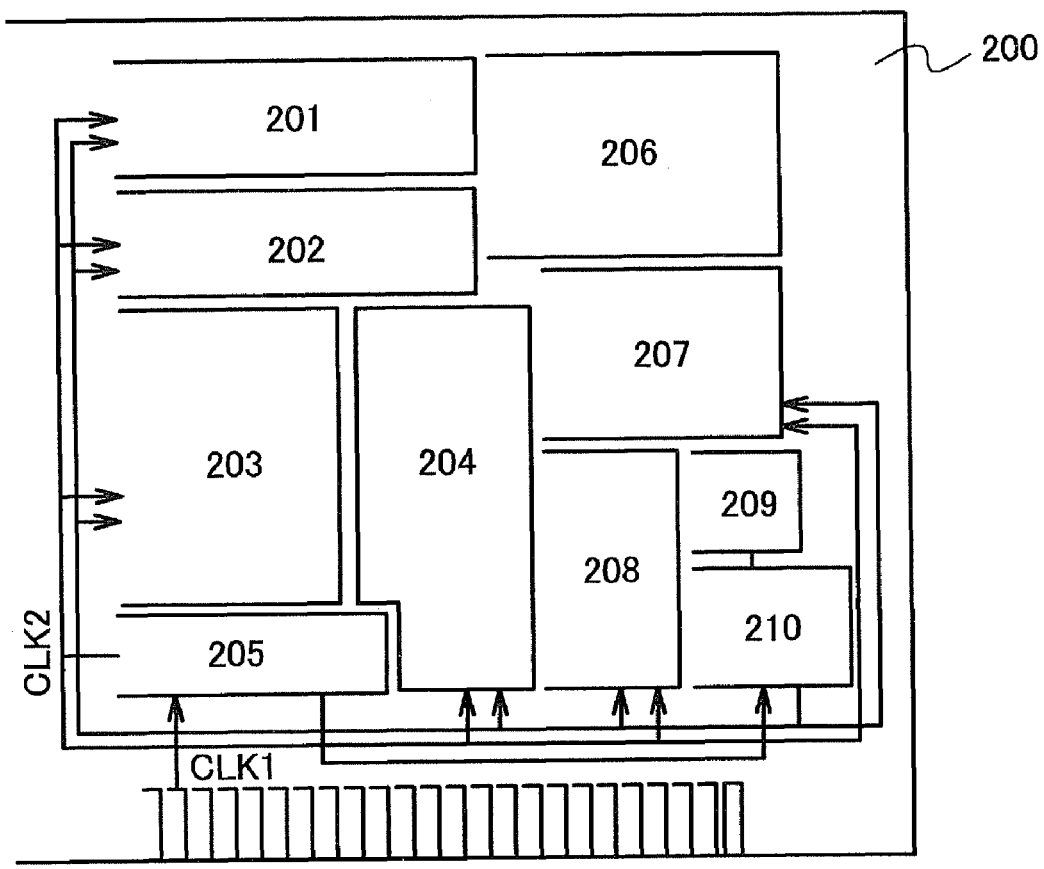
FIG. 6 is a diagram illustrating an example of an electronic device.

First, as an example of a semiconductor device, a microprocessor will be described. FIG. 6 is a block diagram that illustrates a structural example of a microprocessor 200.

The microprocessor 200 includes an arithmetic logic unit (ALU) 201, an ALU controller 202, an instruction decoder 203, an interrupt controller 204, a timing controller 205, a register 206, a register controller 207, a bus interface (bus I/F) 208, a read only memory 209, and a memory interface 210.

An instruction inputted to the microprocessor 200 via the bus interface 208 is inputted to the instruction decoder 203 and decoded, and then inputted to the ALU controller 202, the interrupt controller 204, the register controller 207, and the timing controller 205. The ALU controller 202, the interrupt controller 204, the register controller 207, and the timing controller 205 perform various controls based on the decoded instruction.

The ALU controller 202 generates a signal for controlling an operation of the ALU 201. The interrupt controller 204 is a circuit that processes an interruption request from an external input/output device or a peripheral circuit during program execution of the microprocessor 200, and the interrupt controller 204 determines priority of the interruption request or a mask state and processes the interruption request. The register controller 207 generates an address of the register 206 and performs reading and writing from/to the register 206 depending on a state of the microprocessor 200. The timing controller 205 generates signals for controlling timing of an operation of the ALU 201, the ALU controller 202, the instruction decoder 203, the interrupt controller 204, and the register controller 207. For example, the timing controller 205 is provided with an internal clock generator that generates an internal clock signal CLK2 based on a reference clock signal CLK1. As illustrated in FIG. 6, the internal clock signal CLK2 is inputted to another circuit.

Electronic circuits in the microprocessor 200 shown in FIG. 6 can each be manufactured using a transistor shown in FIG. 5C or a CMOS circuit shown in FIG. 6.

Figure 7:
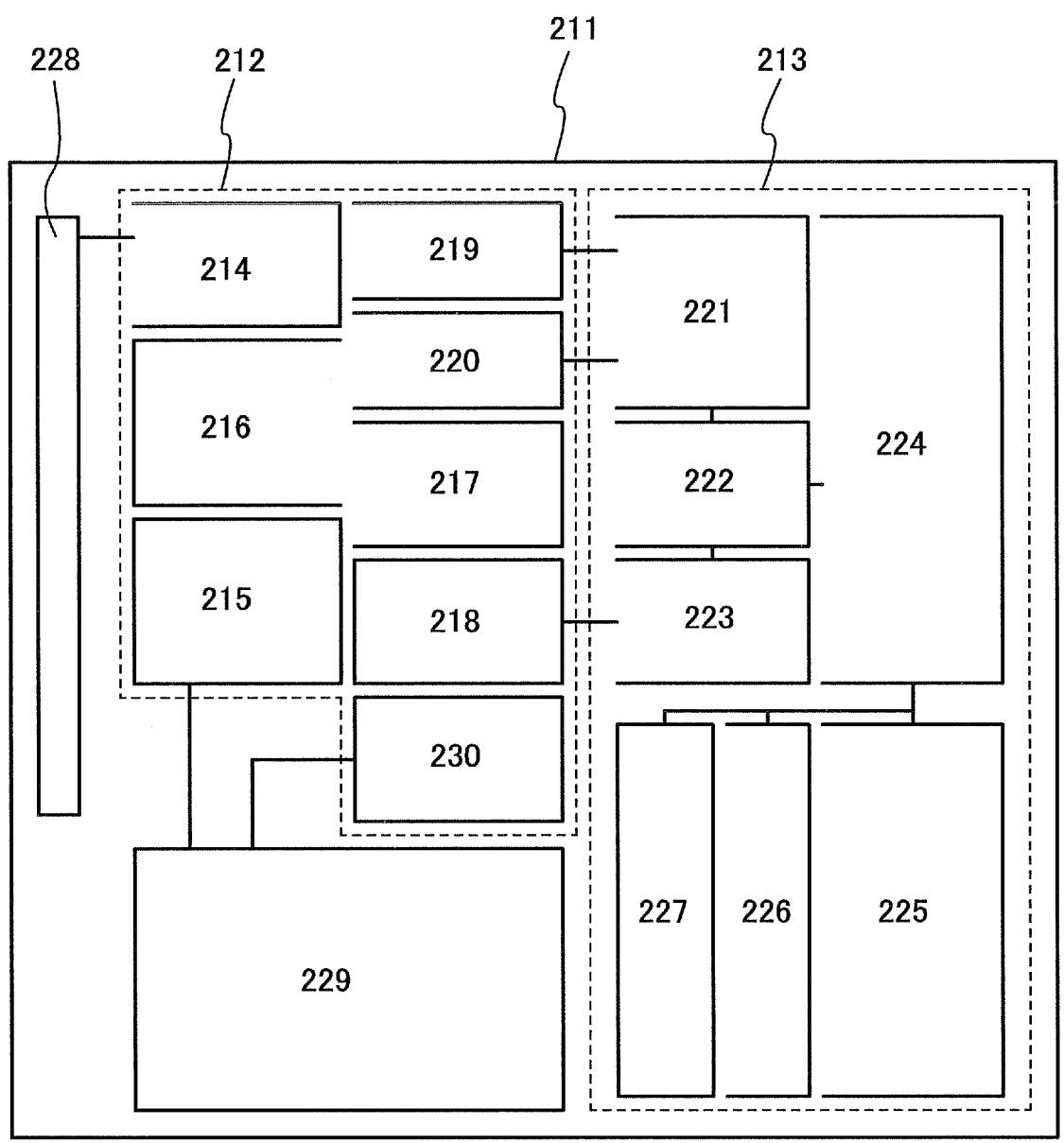
FIG. 7 is a diagram illustrating an example of an electronic device.

Next, an example of a semiconductor device provided with a function for performing transmission/reception of data without contact and an arithmetic function are described. FIG. 7 is a block diagram that illustrates a structural example of such a semiconductor device. A semiconductor device 211 illustrated in FIG. 7 functions as an arithmetic processing unit that operates by transmitting/receiving a signal to/from an external device through wireless communication.

As illustrated in FIG. 7, the semiconductor device 211 includes an analog circuit portion 212 and a digital circuit portion 213. The analog circuit portion 212 includes a resonance circuit 214 having a resonant capacitor, a rectification circuit 215, a constant voltage circuit 216, a reset circuit 217, an oscillation circuit 218, a demodulation circuit 219, and a modulation circuit 220. Further, the digital circuit portion 213 includes an RF interface 221, a control register 222, a clock controller 223, an interface 224, a central processing unit 225, a random access memory 226, and a read only memory 227.

A summary of the operation of the semiconductor device 211 is as follows. An induced electromotive force is generated in the resonance circuit 214 using a signal received by an antenna 228. The induced electromotive force passes through the rectification circuit 215 and is stored in a capacitor 229. This capacitor 229 is preferably a capacitor such as a ceramic capacitor or an electric double layer capacitor. The capacitor 229 does not always have to be integrated with a substrate included in the semiconductor device 211, and can also be incorporated in the semiconductor device 211 as a separate component.

The reset circuit 217 generates a signal that resets and initializes the digital circuit portion 213. For example, a signal that rises with delay after increase in power supply voltage is generated as a reset signal. The oscillation circuit 218 changes the frequency and duty ratio of a clock signal depending on a control signal generated in the constant voltage circuit 216. The demodulation circuit 219 is a circuit that demodulates a reception signal, and the modulation circuit 220 is a circuit that modulates data to be transmitted.

For example, the demodulation circuit 219 is formed using a low-pass filter and binarizes an amplitude-modulated (ASK) received signal based on variation of amplitude. Since the modulation circuit 220 transmits transmission data by varying the amplitude of an amplitude-modulated (ASK) transmission signal, the modulation circuit 220 changes the amplitude of a communication signal by changing a resonance point of the resonance circuit 214.

The clock controller 223 generates a control signal for changing the frequency and duty ratio of a clock signal depending on power supply voltage or current consumption in the central processing unit 225. Monitoring of the power supply voltage is performed in a power supply management circuit 230.

A signal inputted to the semiconductor device 211 from the antenna 228 is demodulated in the demodulation circuit 219, and then separated into a control command, data, and the like in the RF interface 221. The control command is stored in the control register 222. In the control command, instructions for reading data that is stored in the read only memory 227, writing data in the random access memory 226, performing an arithmetic calculation in the central processing unit 225, and the like are included.

The central processing unit 225 accesses the read only memory 227, the random access memory 226, and the control register 222 via the interface 224. The interface 224 has a function of generating an access signal corresponding to any of the read only memory 227, the random access memory 226, and the control register 222, based on an address requested by the central processing unit 225.

As an arithmetic method of the central processing unit 225, a method may be employed in which an operating system (OS) is stored in the read only memory 227 and a program is read and executed at the time of starting operation. Alternatively, a method may be employed in which a dedicated circuit is provided as an arithmetic circuit and an arithmetic process is performed using hardware. In a method of using both hardware and software, part of an arithmetic process is performed in a dedicated arithmetic circuit, and then the rest of the arithmetic process is performed using a program in the central processing unit 225.

Electronic circuits in the semiconductor device 211 shown in FIG. 7 can each be manufactured using a transistor shown in FIG. 5C or a CMOS circuit shown in FIG. 6D.

Next, a display device is described as a structural example of a semiconductor device, with reference to FIGS. 8A and 8B and FIGS. 9A and 9B.

Figure 8A:
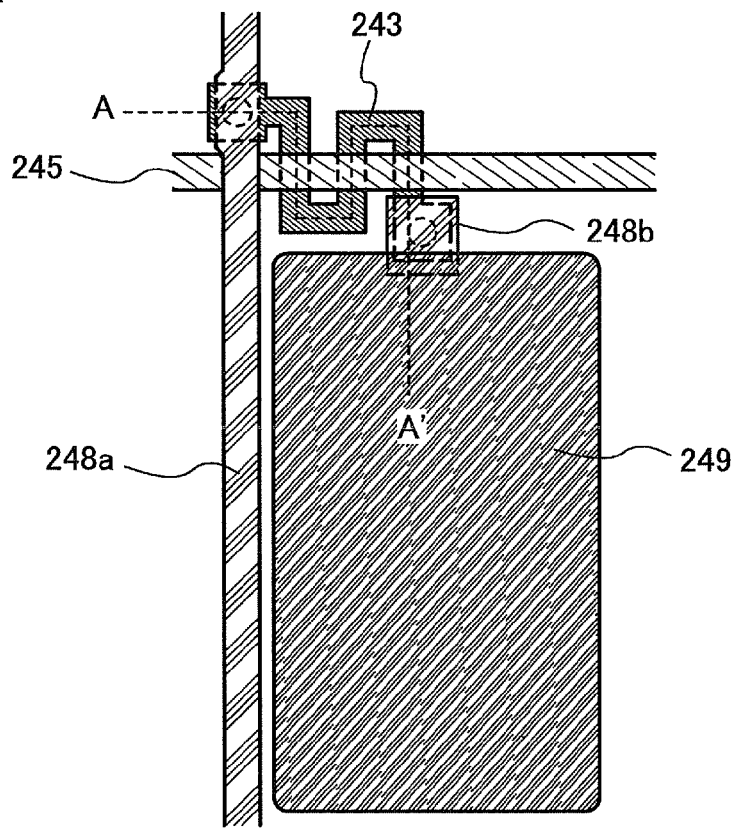
FIGS. 8A and 8B are drawings illustrating an example of an electronic device.
Figure 8B:
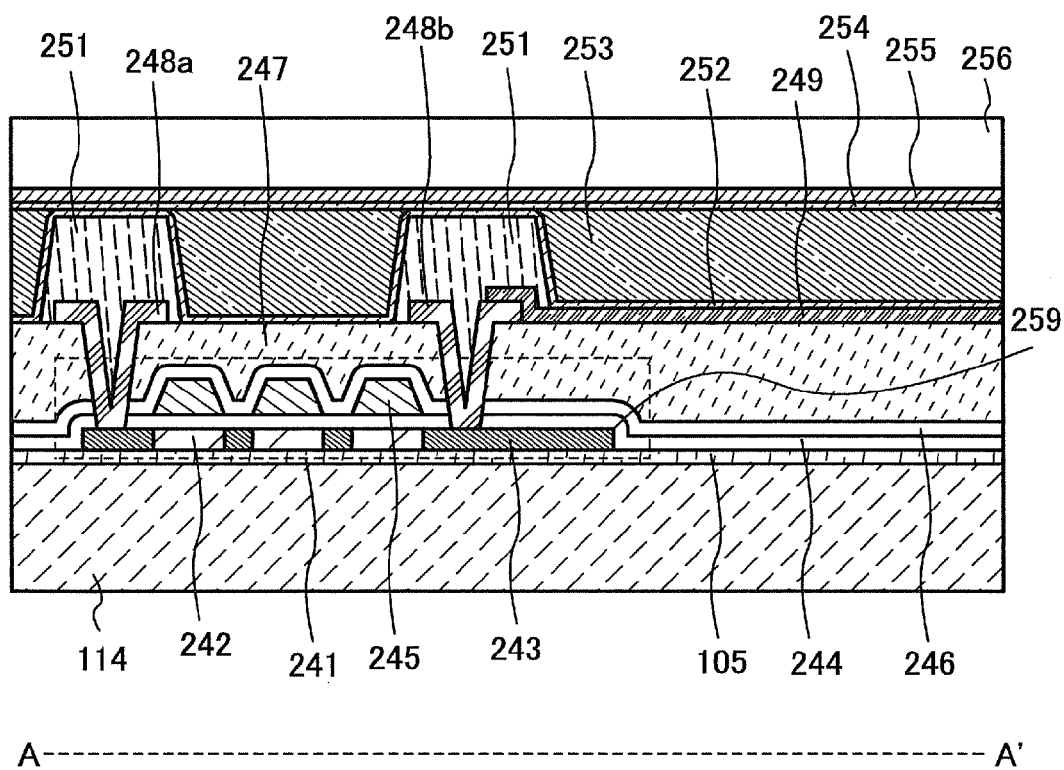

FIGS. 8A and 8B are views that illustrate a structural example of a liquid crystal display device. FIG. 8A is a plan view of a pixel of the liquid crystal display device, and FIG. 8B is a cross-sectional view taken along section line A-A' of FIG. 8A.

In FIG. 8A, an island-like semiconductor film 259 is formed from the single crystal semiconductor layer 106, and forms a transistor 241 of the pixel. The pixel includes the island-like semiconductor film 259; a scan line 245 that crosses the island-like semiconductor film 259; a signal line 248a that crosses the scan line 245; a pixel electrode 249; and an electrode 248b that electrically connects the pixel electrode 249 to the island-like semiconductor film 259.

As illustrated in FIG. 8B, an insulating layer 105, the island-like semiconductor film 259, and a gate insulating film 244 are formed over a substrate 114. The island-like semiconductor film 259 is formed by etching the single crystal semiconductor layer 106. In the island-like semiconductor film 259, a channel formation region 242 and an n-type impurity region 243 are formed. A gate electrode of the transistor 241 is included in the scan line 245, and one of a source electrode and a drain electrode is included in the signal line 248a.

An interlayer insulating film 246 is formed to cover the island-like semiconductor film 259, the gate insulating film 244, and the scan line 245. The interlayer insulating film 246 may be formed in a manner similar to the step for forming the interlayer insulating film 142. An interlayer insulating film 247 is formed over the interlayer insulating film 246. The interlayer insulating film 247 may be formed in a manner similar to the step for forming the interlayer insulating film 147.

Over the interlayer insulating film 247, the signal line 248a, the electrode 248b, and the pixel electrode 249 are provided. Over the interlayer insulating film 247, a columnar spacer 251 is formed, and an orientation film 252 is formed so as to cover the signal line 248a, the electrode 248b, the pixel electrode 249, and the columnar spacer 251.

A substrate 256 is provided with a counter electrode 255 and an orientation film 254 which covers the counter electrode 255. The columnar spacer 251 is formed to maintain a space between the substrate 114 and the substrate 256. In the space formed by the columnar spacer 251, a liquid crystal layer 253 is formed.

At connection portions of the signal line 248a and the electrode 248b with the impurity region 243, because there are steps formed in the interlayer insulating film 247 due to formation of contact holes, orientation of liquid crystals in the liquid crystal layer 253 in these connection portions becomes disordered easily. Accordingly, the columnar spacer 251 is formed at these step portions to prevent orientation disorder of a liquid crystal.

Figure 9A:
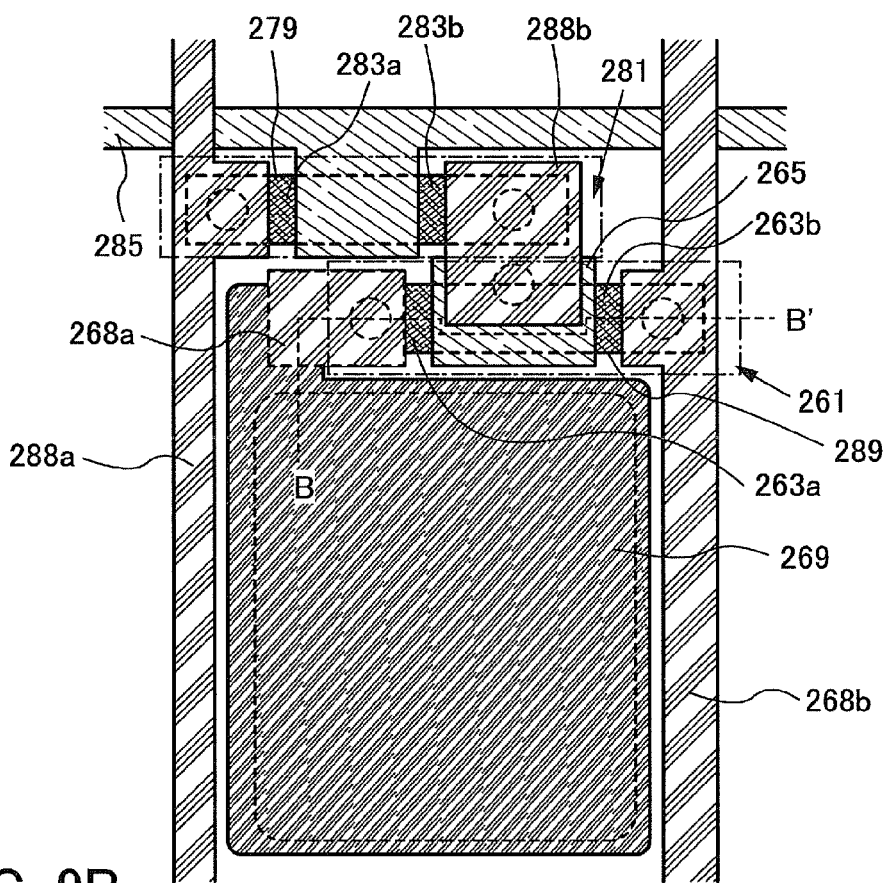
FIGS. 9A and 9B are drawings illustrating an example of an electronic device.
Figure 9B:
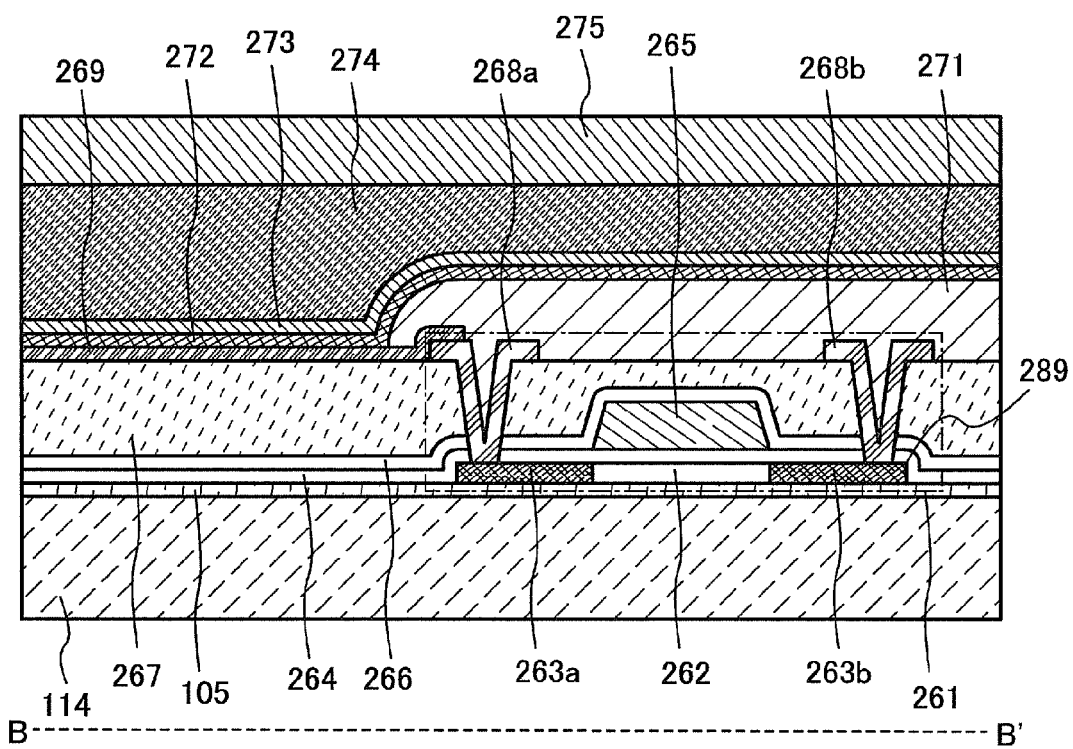

Next, an electroluminescent display device (hereinafter referred to as an "EL display device") is described with reference to FIGS. 9A and 9B. FIG. 9A is a plan view of a pixel of the EL display device, and FIG. 9B is a cross-sectional view taken along section line B-B' of FIG. 9A, which indicates a display control transistor 261 of the pixel.

As illustrated in FIG. 9A, the pixel includes a selection transistor 281, a display control transistor 261, a scan line 285, a signal line 288a, a current supply line 268b, and a pixel electrode 269. Each pixel is provided with a light-emitting element with a structure in which a layer formed to contain an electroluminescent material (EL layer) is interposed between a pair of electrodes. One of the electrodes of the light-emitting element is the pixel electrode 269.

The selection transistor 281 includes an island-like semiconductor film 279 that is formed using the single crystal semiconductor layer 106. In the island-like semiconductor film 279, an impurity region 283a and an impurity region 283b are formed. In the selection transistor 281, a gate electrode is included in the scan line 285, one of a source electrode and a drain electrode is included in the signal line 288a, and the other of the source electrode and the drain electrode is formed as an electrode 288b.

In the display control transistor 261, a gate electrode 265 is electrically connected to the electrode 288b, and one of a source electrode and a drain electrode is formed as an electrode 268a that is electrically connected to the pixel electrode 269, and the other of the source electrode and the drain electrode is included in the current supply line 268b.

The display control transistor 261 is a p-channel transistor and includes an island-like semiconductor film 289 that is formed using the single crystal semiconductor layer 106.

As illustrated in FIG. 9B, in the island-like semiconductor film 289, a channel formation region 262, a p-type impurity region 263a, and a p-type impurity region 263b are formed. A gate insulating film 264 is formed over the island-like semiconductor film 289. An interlayer insulating film 266 and an interlayer insulating film 267 are formed so as to cover the gate electrode 265 of the display control transistor 261. Over the interlayer insulating film 267, the signal line 288a, the current supply line 268b, the electrode 288b, the electrode 268a, and the like are formed.

In addition, over the interlayer insulating film 267, the pixel electrode 269 that is electrically connected to the electrode 268a is formed. A peripheral portion of the pixel electrode 269 is surrounded by an insulating partition layer 271. An EL layer 272 is formed over the pixel electrode 269, and a counter electrode 273 is formed over the EL layer 272. A substrate 275 is provided as a reinforcing plate, and the substrate 275 is fixed to a substrate 114 with a resin layer 274.

In accordance with the present invention disclosed in the present specification, a wide variety of electronic devices can be manufactured. The electronic devices include a video camera, a digital camera; a navigation system; an audio reproducing device (a car audio system, an audio component, and the like); a computer; a game machine; a personal digital assistant (a mobile computer, a cellular phone, a mobile game machine, an electronic book reader, and the like); a display device that displays image data such as an image reproduction device provided with a recording medium (specifically, a digital versatile disc (DVD)); and the like.

Figure 10A:
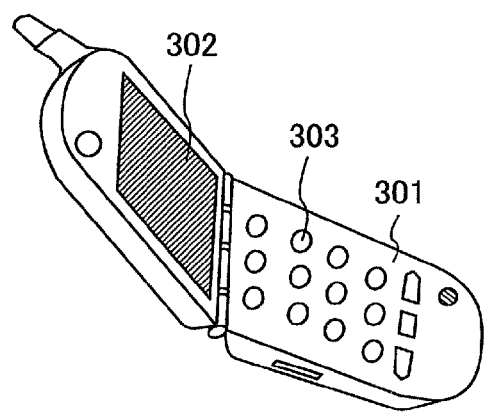
FIGS. 10A to 10C are drawings illustrating examples of an electronic device.

With reference to FIGS. 10A to 10C and FIGS. 11A to 11C, specific modes of the electronic device are described. FIG. 10A is an external view that illustrates an example of a cellular phone 301. This cellular phone 301 has a structure in which a display portion 302, operation switches 303, and the like are included. By applying the liquid crystal display device shown in FIGS. 8A and 8B or the EL display device shown in FIGS. 9A and 9B to the display portion 302, the display portion 302 can have excellent image quality with little display unevenness. Further, the transistor shown in FIG. 5C or the CMOS circuit shown in FIG. 5D can be used for various circuits in the cellular phone 301.

Figure 10B:
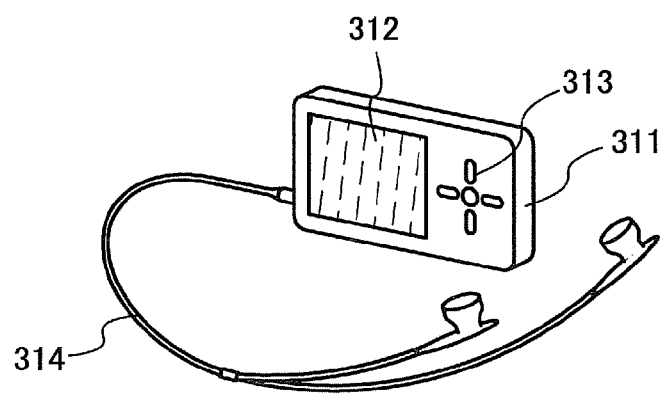

FIG. 10B is an external view that illustrates a structural example of a digital player 311. The digital player 311 includes a display portion 312, an operation portion 313, an earpiece 314, and the like. Alternatively, headphones or a wireless earpiece can be used instead of the earpiece 314. By applying the liquid crystal display device described in FIGS. 8A and 8B or the EL display device described in FIGS. 9A and 9B to the display portion 312, even in the case where the screen size is about 0.3 inches to 2 inches, an image with high precision and a large amount of text information can be displayed. Further, the transistor shown in FIG. 5C or the CMOS circuit shown in FIG. 5D can be used for various circuits in the digital player 311.

Figure 10C:
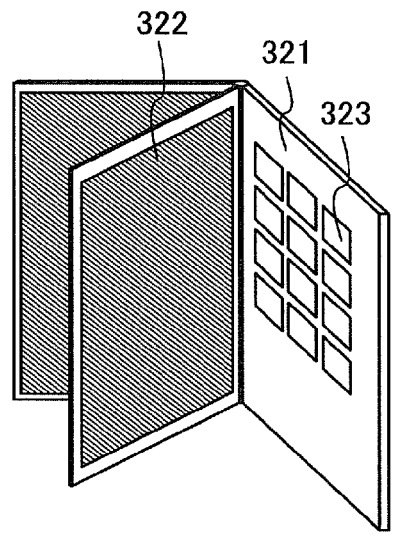

FIG. 10C is an external view of an electronic book reader 321. This electronic book reader 321 includes a display portion 322 and operation switches 323. A modem may be incorporated into the electronic book reader 321, or the semiconductor device 211 in FIG. 7 may be incorporated so that the electronic book reader 321 has a structure by which information can be transmitted/received wirelessly. By applying the liquid crystal display device described in FIGS. 8A and 8B or the EL display device described in FIGS. 9A and 9B to the display portion 322, a display with high image quality can be performed. Further, the transistor shown in FIG. 5C or the CMOS circuit shown in FIG. 5D can be used for various circuits in the electronic book reader 321.

Figure 11A:
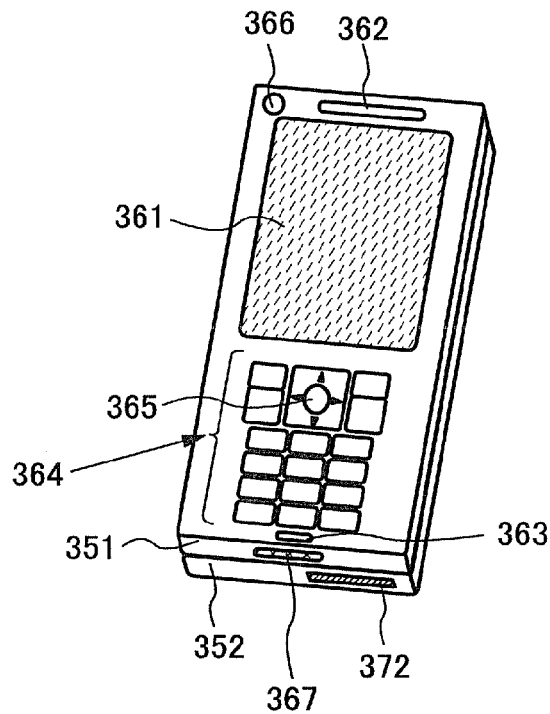
FIGS. 11A to 11C are drawings illustrating an example of an electronic device.
Figure 11B:
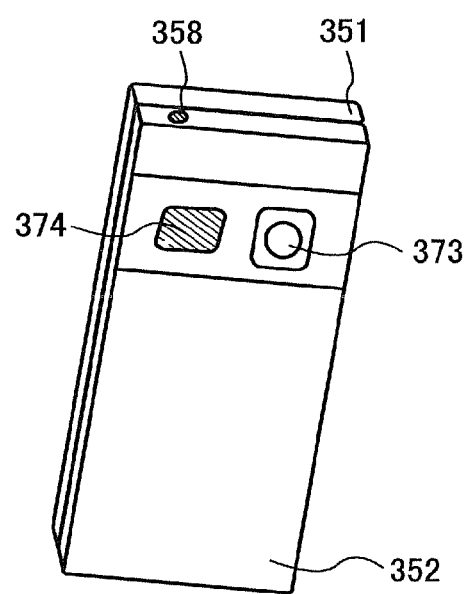
Figure 11C:
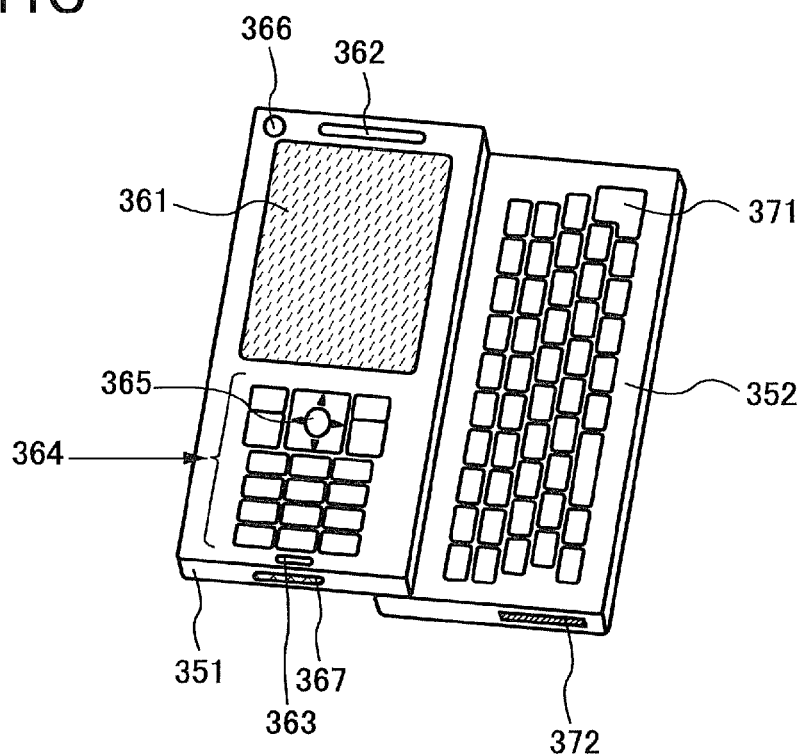
Figure 12A:
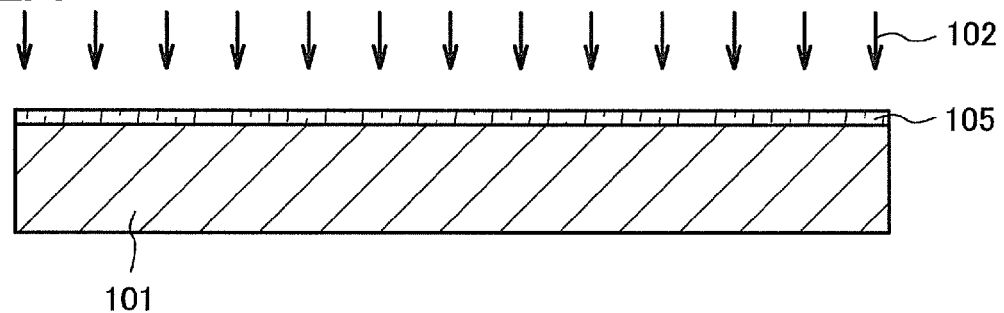
FIGS. 12A to 12E are cross-sectional views illustrating a manufacturing process of a semiconductor device.
Figure 12B:
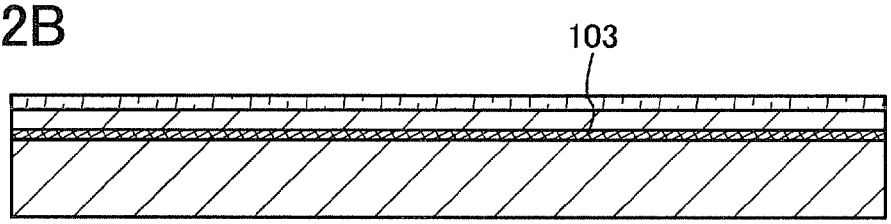
Figure 12C:
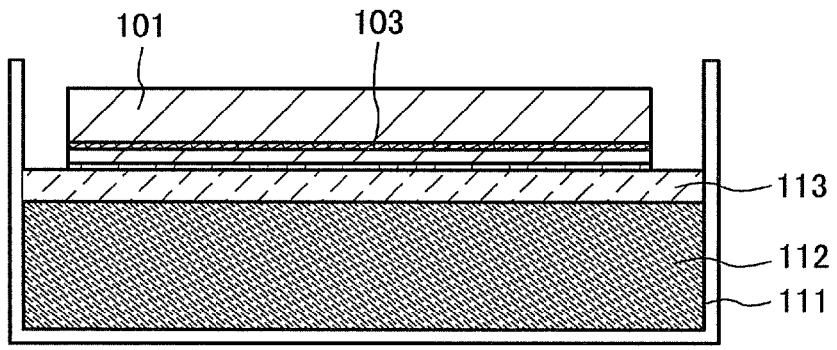
Figure 12D:
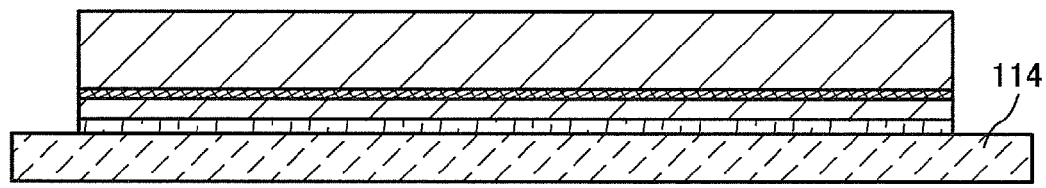
Figure 12E:
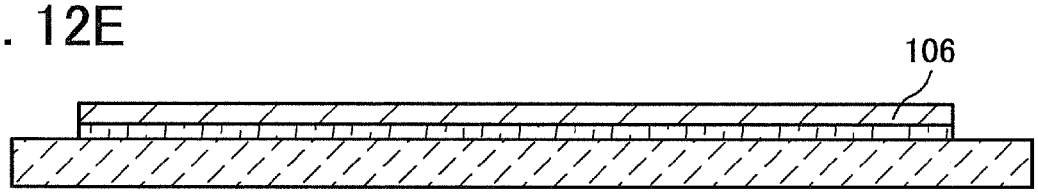

FIGS. 11A to 11C illustrate an example of a phone which is different from the cellular phone illustrated in FIG. 10A. FIGS. 11A to 11C illustrate an example of a structure of a smartphone to which the present invention disclosed in the present specification is applied. FIG. 11A is a front view, FIG. 11B is a rear view, and FIG. 11C is a development view.

The smartphone has two housings 351 and 352. The smartphone has both a function of a cellular phone and a function of a personal digital assistant, and incorporates a computer provided to be able to conduct a variety of data processing in addition to verbal communication.

The housing 351 includes a display portion 361, a speaker 362, a microphone 363, operation keys 364, a pointing device 365, a front camera lens 366, an external connection terminal 367, and the like, while the housing 352 includes an earphone terminal 358, a keyboard 371, an external memory slot 372, a rear camera lens 373, a light 374, and the like. In addition, an antenna is incorporated in the housing 351.

Further, in addition to the above structure, the smartphone may incorporate a non-contact IC chip, a small size memory device, or the like.

The housings 351 and 352 which are shown in FIG. 11A are put together to be lapped with each other are developed by sliding as illustrated in FIG. 11C. In the display portion 361, the liquid crystal display device shown in FIGS. 8A and 8B and the EL display device shown in FIGS. 9A and 9B can be incorporated, and display direction can be changed as appropriate depending on a use mode. Further, the transistor shown in FIG. 5C or the CMOS circuit shown in FIG. 5D can be used for circuits inside the smartphone.

Because the front camera lens 361 is provided in the same plane as the display portion 366, the smartphone can be used as a videophone. A still image and a moving image can be taken by the rear camera lens 373 and the light 374 by using the display portion 361 as a view finder. The speaker 362 and the microphone 363 can be used for uses of videophone, recording, playback, and the like without being limited to verbal communication.

With use of the operation keys 364, operation of incoming and outgoing calls, simple information input of electronic mails or the like, scrolling of a screen, cursor motion and the like are possible. If much information is needed to be treated, such as documentation, use as a personal digital assistant, and the like, the use of the keyboard 371 is convenient.

Further, the housings 351 and 352 which are put together to be lapped with each other and are shown in FIG. 11A can be developed by sliding as illustrated in FIG. 11C, so that the smartphone can be used as a personal digital assistant. In this case, smooth operation can be conducted by using the keyboard 371 or the pointing device 365.

The external connection terminal 367 can be connected to an AC adapter and various types of cables such as a USB cable, and charging and data communication with a personal computer or the like are possible.

Moreover, a large amount of data can be stored by inserting a storage medium into the external memory slot 372 and can be moved.

Further, the smartphone may include an infrared communication function, an USB port, a function of a television receiver, or the like, in addition to the above function.

This application is based on Japanese Patent Application serial no. 2008-035851 filed with Japan Patent Office on Feb. 18, 2008, the entire contents of which are hereby incorporated by reference.

What is claimed is:

1. A method for manufacturing a semiconductor device comprising the steps of:
    irradiating with an ion beam a single crystal semiconductor substrate provided with an insulating film to form a damaged region in the single crystal semiconductor substrate,
    floating liquid glass over a liquid denser than the liquid glass to shape the liquid glass into a plate,
    disposing the single crystal semiconductor substrate provided with the damaged region over the plate-like liquid glass so that the insulating film and the liquid glass face each other,
    cooling the plate-like liquid glass and the single crystal semiconductor substrate slowly, whereby a glass substrate is obtained from the plate-like liquid glass and concurrently the glass substrate and the single crystal semiconductor substrate are bonded together, and
    separating a single crystal semiconductor layer from the single crystal semiconductor substrate along the damaged region.

2. The method for manufacturing a semiconductor device according to claim 1, wherein the single crystal semiconductor substrate is one of a single crystal silicon substrate, a single crystal germanium substrate, a single crystal silicon germanium substrate, a compound semiconductor substrate of gallium arsenide, and a compound semiconductor substrate of indium phosphide.

3. The method for manufacturing a semiconductor device according to claim 1, wherein the insulating film includes one of or two or more of a silicon oxide film, a silicon nitride film, a silicon oxynitride film, a silicon nitride oxide film, a germanium oxide film, a germanium nitride film, a germanium oxynitride film, a germanium nitride oxide film, an aluminum oxide film, a tantalum oxide film, a hafnium oxide film, an aluminum nitride film, an aluminum oxynitride film, and an aluminum nitride oxide film.

4. The method for manufacturing a semiconductor device according to claim 1, wherein the insulating film is an oxide film formed by oxidation of a surface of the single crystal semiconductor substrate in gas including chlorine.

5. The method for manufacturing a semiconductor device according to claim 1, wherein the ion beam is a beam including a hydrogen ion.

6. A method for manufacturing a semiconductor device comprising the steps of:
    irradiating with an ion beam a single crystal semiconductor substrate provided with an insulating film to form a damaged region in the single crystal semiconductor substrate,
    floating liquid glass over a liquid denser than the liquid glass to shape the liquid glass into a plate,
    disposing the single crystal semiconductor substrate provided with the damaged region over the plate-like liquid glass so that the insulating film and the liquid glass face each other,
    cooling the plate-like liquid glass and the single crystal semiconductor substrate slowly, whereby a glass substrate is obtained from the plate-like liquid glass and concurrently the glass substrate and the single crystal semiconductor substrate are bonded together,
    separating a single crystal semiconductor layer from the single crystal semiconductor substrate along the damaged region, and
    taking a foreign matter between the glass substrate and the single crystal semiconductor layer into the glass substrate.

7. The method for manufacturing a semiconductor device according to claim 6, wherein the single crystal semiconductor substrate is one of a single crystal silicon substrate, a single crystal germanium substrate, a single crystal silicon germanium substrate, a compound semiconductor substrate of gallium arsenide, and a compound semiconductor substrate of indium phosphide.

8. The method for manufacturing a semiconductor device according to claim 6, wherein the insulating film includes one of or two or more of a silicon oxide film, a silicon nitride film, a silicon oxynitride film, a silicon nitride oxide film, a germanium oxide film, a germanium nitride film, a germanium oxynitride film, a germanium nitride oxide film, an aluminum oxide film, a tantalum oxide film, a hafnium oxide film, an aluminum nitride film, an aluminum oxynitride film, and an aluminum nitride oxide film.

9. The method for manufacturing a semiconductor device according to claim 6, wherein the insulating film is an oxide film formed by oxidation of a surface of the single crystal semiconductor substrate in gas including chlorine.

10. The method for manufacturing a semiconductor device according to claim 6, wherein the ion beam is a beam-including a hydrogen ion.

11. A method for manufacturing a semiconductor device comprising the steps of:
    irradiating with an ion beam a single crystal semiconductor substrate provided with an insulating film to form a damaged region in the single crystal semiconductor substrate,
    floating liquid glass over a liquid denser than the liquid glass to shape the liquid glass into a plate,
    disposing over the plate-like liquid glass the single crystal semiconductor substrate provided with the damaged region so that the insulating film and the liquid glass face each other,
    sticking a substrate support portion onto a side of the single crystal semiconductor substrate which is opposite to a side where the insulating film is formed,
    cooling the plate-like liquid glass and the single crystal semiconductor substrate slowly, whereby a glass substrate is obtained from the plate-like liquid glass and concurrently the glass substrate and the single crystal semiconductor substrate are bonded together, and
    separating a single crystal semiconductor layer from the single crystal semiconductor substrate onto which the substrate support portion is stuck, along the damaged region.

12. The method for manufacturing a semiconductor device according to claim 11, wherein the single crystal semiconductor substrate is one of a single crystal silicon substrate, a single crystal germanium substrate, a single crystal silicon germanium substrate, a compound semiconductor substrate of gallium arsenide, and a compound semiconductor substrate of indium phosphide.

13. The method for manufacturing a semiconductor device according to claim 11, wherein the insulating film includes one of or two or more of a silicon oxide film, a silicon nitride film, a silicon oxynitride film, a silicon nitride oxide film, a germanium oxide film, a germanium nitride film, a germanium oxynitride film, a germanium nitride oxide film, an aluminum oxide film, a tantalum oxide film, a hafnium oxide film, an aluminum nitride film, an aluminum oxynitride film, and an aluminum nitride oxide film.

14. The method for manufacturing a semiconductor device according to claim 11, wherein the insulating film is an oxide film formed by oxidation of a surface of the single crystal semiconductor substrate in gas including chlorine.

15. The method for manufacturing a semiconductor device according to claim 11, wherein the ion beam is a beam including a hydrogen ion.

16. A method for manufacturing a semiconductor device comprising the steps of:
    forming a porous single crystal semiconductor layer over a single crystal semiconductor substrate,
    forming a dense single crystal semiconductor layer over the porous single crystal semiconductor layer,
    floating liquid glass over a liquid denser than the liquid glass to shape the liquid glass into a plate,
    disposing the single crystal semiconductor substrate provided with the porous single crystal semiconductor layer and the dense single crystal semiconductor layer over the plate-like liquid glass so that the single crystal semiconductor substrate and the liquid glass face each other,
    cooling the plate-like liquid glass and the single crystal semiconductor substrate slowly, whereby a glass substrate is obtained from the plate-like liquid glass and concurrently the glass substrate and the single crystal semiconductor substrate are bonded together, and
    separating the dense single crystal semiconductor layer from the single crystal semiconductor substrate along the porous single crystal semiconductor layer.

17. The method for manufacturing a semiconductor device according to claim 16, wherein the porous single crystal semiconductor layer is formed by anodic oxidation of the single crystal semiconductor substrate.

18. The method for manufacturing a semiconductor device according to claim 16, wherein the single crystal semiconductor substrate is one of a single crystal silicon substrate, a single crystal germanium substrate, a single crystal silicon germanium substrate, a compound semiconductor substrate of gallium arsenide, and a compound semiconductor substrate of indium phosphide.

19. A method for manufacturing a semiconductor device comprising the steps of:
- irradiating with an ion beam a single crystal semiconductor substrate provided with an insulating film to form a damaged region in the single crystal semiconductor substrate,
- disposing solid glass over a solid of a liquid material denser than liquid glass,
- disposing over the solid glass the single crystal semiconductor substrate provided with the damaged region so that the insulating film and the solid glass face each other,
- heating the solid glass and the solid of a liquid material denser than liquid glass, so that the solid glass is turned into the liquid glass and the solid of a liquid material denser than the liquid glass is turned into the liquid material,
- cooling the liquid glass and the single crystal semiconductor substrate slowly, whereby a glass substrate is obtained from the liquid glass and concurrently the glass substrate and the single crystal semiconductor substrate are bonded together, and
- separating a single crystal semiconductor layer from the single crystal semiconductor substrate along the damaged region.

20. The method for manufacturing a semiconductor device according to claim 18, wherein the single crystal semiconductor substrate is one of a single crystal silicon substrate, a single crystal germanium substrate, a single crystal silicon germanium substrate, a compound semiconductor substrate of gallium arsenide, and a compound semiconductor substrate of indium phosphide.

* * * * *